(12) United States Patent
Hiura et al.

(10) Patent No.: US 8,207,011 B2
(45) Date of Patent: Jun. 26, 2012

(54) METHOD OF MANUFACTURING PHOTOELECTRIC CONVERSION DEVICE

(75) Inventors: Yoshikazu Hiura, Kanagawa (JP); Riho Kataishi, Kanagawa (JP); Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 26 days.

(21) Appl. No.: 12/860,283

(22) Filed: Aug. 20, 2010

(65) Prior Publication Data
US 2011/0053311 A1    Mar. 3, 2011

(30) Foreign Application Priority Data

Aug. 25, 2009 (JP) ................. 2009-194806
Aug. 25, 2009 (JP) ................. 2009-194846
Aug. 25, 2009 (JP) ................. 2009-194855

(51) Int. Cl.
H01L 21/00 (2006.01)
(52) U.S. Cl. ............ 438/97; 438/488; 136/255
(58) Field of Classification Search .......... 438/96, 438/97, 488; 257/E31.043; 136/255, 258
See application file for complete search history.

(56) References Cited

U.S. PATENT DOCUMENTS

| | | | |
|---|---|---|---|
| 4,409,134 A | 10/1983 | Yamazaki | |
| 7,125,758 B2 | 10/2006 | Choi et al. | |
| 7,754,294 B2 | 7/2010 | Choi et al. | |
| 2004/0058492 A1* | 3/2004 | Tatsumi | 438/240 |
| 2005/0233092 A1 | 10/2005 | Choi et al. | |
| 2005/0251990 A1 | 11/2005 | Choi et al. | |
| 2005/0255257 A1 | 11/2005 | Choi et al. | |
| 2006/0005771 A1 | 1/2006 | White et al. | |
| 2006/0228496 A1 | 10/2006 | Choi et al. | |
| 2006/0236934 A1 | 10/2006 | Choi et al. | |

(Continued)

FOREIGN PATENT DOCUMENTS
EP     1 595 974 A2    11/2005
(Continued)

*Primary Examiner* — Phuc Dang
(74) *Attorney, Agent, or Firm* — Nixon Peabody LLP; Jeffrey L. Costellia

(57) ABSTRACT

Provided is a technique for manufacturing a photoelectric conversion element using a dense crystalline semiconductor film without a cavity between crystal grains. A method of manufacturing a photoelectric conversion device having a first electrode, a unit cell, and a second electrode over a substrate includes the steps of: forming a plasma region between a first electrode and a second electrode by supplying high-frequency power of 60 MHz or less to the first electrode under a condition where a pressure of a reactive gas in a chamber of a plasma CVD apparatus is set to from 450 Pa to 13332 Pa, and a distance between the first electrode and the second electrode of the plasma CVD apparatus is set to from 1 mm to 20 mm, preferably, 4 mm to 16 mm; forming deposition precursors including a crystalline semiconductor in a gas phase including the plasma region; forming a crystal nucleus having a grain size of from 5 nm to 15 nm by depositing the deposition precursors; and forming a semiconductor film having a first conductivity type, a semiconductor film effective in photoelectric conversion, or a semiconductor film having a first conductivity type in the unit cell, by growing a crystal from the crystal nucleus.

16 Claims, 20 Drawing Sheets

U.S. PATENT DOCUMENTS

| | | | |
|---|---|---|---|
| 2007/0063183 A1* | 3/2007 | Kato et al. | 257/14 |
| 2008/0020146 A1 | 1/2008 | Choi et al. | |
| 2009/0072237 A1 | 3/2009 | Yamazaki et al. | |
| 2009/0223557 A1* | 9/2009 | Park et al. | 136/255 |
| 2010/0009516 A1* | 1/2010 | Yao et al. | 438/458 |
| 2011/0053357 A1 | 3/2011 | Yamazaki | |
| 2011/0053358 A1 | 3/2011 | Toriumi et al. | |

FOREIGN PATENT DOCUMENTS

| | | |
|---|---|---|
| JP | 2004-296526 | 10/2004 |
| JP | 2005-259853 | 9/2005 |
| JP | 2005-328021 | 11/2005 |

* cited by examiner 143  144  141

141  143

143 144 141

141 143

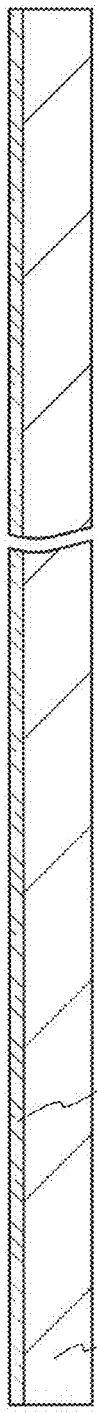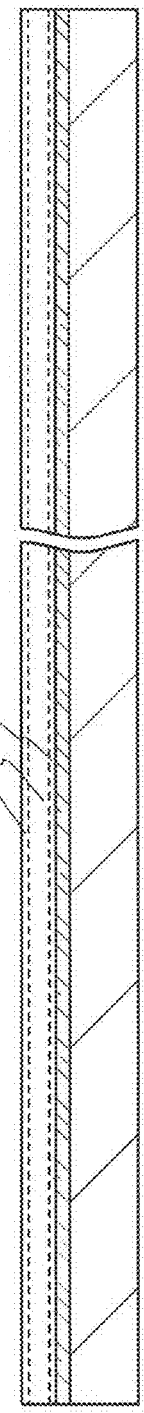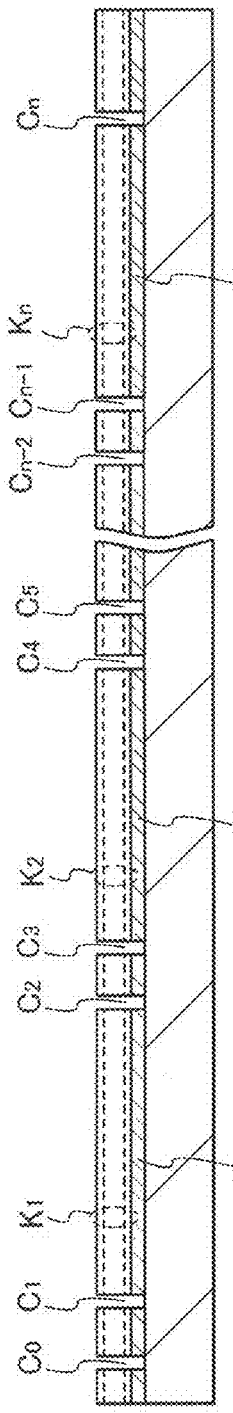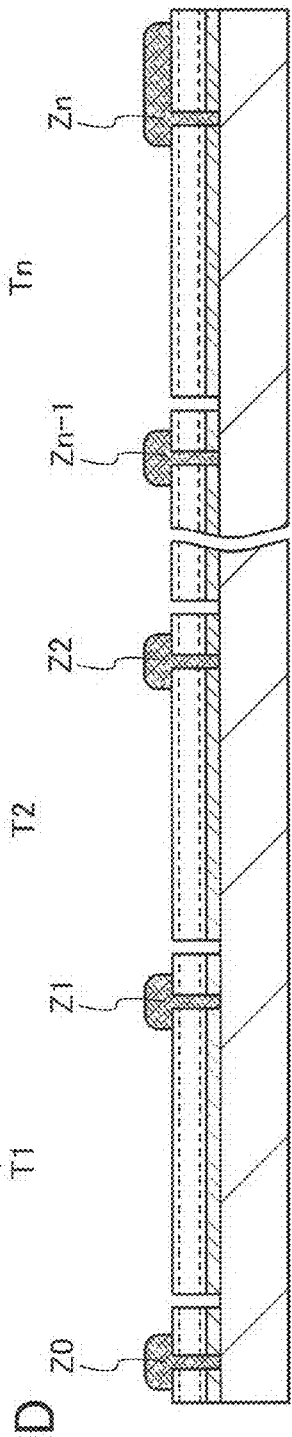
FIG. 16A
FIG. 16B
FIG. 16C
FIG. 16D

METHOD OF MANUFACTURING PHOTOELECTRIC CONVERSION DEVICE

CROSS REFERENCE TO RELATED APPLICATIONS

The instant application claims the benefit of foreign priority applications Serial No. 2009-194806 filed in Japan on Aug. 25, 2009; Serial No. 2009-194855 filed in Japan on Aug. 25, 2009; and Serial No. 2009-194846 filed in Japan on Aug. 25, 2009.

BACKGROUND OF THE INVENTION

1. Field of the Invention

An embodiment of the present invention relates to a method of manufacturing a photoelectric conversion device including a crystalline semiconductor film using a vapor deposition method.

2. Description of the Related Art

In a technical field of thin film transistors, a plasma chemical vapor deposition (plasma CVD) method which is used for manufacture of a semiconductor film is employed, and various improvements have been attempted to manufacture products with higher yields.

For example, an electrode structure of a plasma CVD apparatus is disclosed where an electrode for generating plasma in a reaction chamber is provided with cylindrical recessed portions and the cylindrical recessed portions are connected to each other through a groove which is narrower than the diameter of the cylindrical recessed portion (see Patent Document 1).

In addition, disclosed is a gas diffuser plate (a so-called shower plate) having a gas flow path, the diameter, depth, and surface area of which gradually increase toward an edge portion from a center portion, for dispersing gas in a treatment chamber and forming films uniform in thickness and characteristics (see Patent Document 2). As another example, disclosed is a technique for forming a film under the following conditions for forming higher quality films more efficiently: a ladder-like electrode is used; an ultra high-frequency power of 100 MHz is supplied at a gas pressure of 400 Pa; and a film formation rate is set to 2 nm/second with a distance of 6 mm between the ladder-like electrode and a substrate (see Patent Document 3).

REFERENCES

[Patent Document 1] Japanese Published Patent Application No. 2004-296526
[Patent Document 2] Japanese Published Patent Application No. 2005-328021
[Patent Document 3] Japanese Published Patent Application No. 2005-259853

SUMMARY OF THE INVENTION

However, a conventional plasma CVD apparatus has a structural defect in which an electric field is locally concentrated and therefore has not been able to manufacture a dense microcrystalline semiconductor film. For example, a recessed portion or a projected portion is provided on a surface of a flat-plate electrode, whereby an electric field has been concentrated at a corner of the recessed portion or the projected portion. Therefore, a reactive gas reacts intensely in a region where an electric field is concentrated, and particles which are abnormally grown through reaction in a gas phase are included in a deposited film. Accordingly, a dense semiconductor film has not been able to be formed.

In view of the circumstances described above, an object of an embodiment of the invention disclosed in this specification is to provide a technique for manufacturing a photoelectric conversion element using a dense crystalline semiconductor film (e.g., a microcrystalline semiconductor film) without a cavity between crystal grains.

An embodiment of the present invention is a method in which a high-density plasma region is formed in the vicinity of a gas supply port, through which a reactive gas is supplied to a reaction chamber, a crystal of a semiconductor is grown in a gas phase including the high-density plasma region and the crystal is deposited as a film.

It is preferable to increase a reaction pressure and reduce a distance between electrodes in order to grow a crystal of a semiconductor in a gas phase. As the reaction pressure is higher, there is an increase in the probability of collision reaction between radicals generated by glow discharge and between the radical and a reaction gas molecule. By reducing the distance between electrodes, a crystalline deposition precursor is made to reach to a deposition surface of a substrate before being enlarged, and the crystalline deposition precursor becomes a crystal nucleus on the deposition surface. Accordingly, the crystal nucleus is grown, whereby a dense microcrystalline semiconductor film having crystallinity can be formed. Then, the crystalline deposition precursor is generated in a gas phase, whereby a microcrystalline semiconductor film having favorable crystallinity can be formed from the early stage of deposition.

In addition, it is preferable to add a rare gas to the reactive gas. The rare gas introduced into the reaction chamber together with the reactive gas has the effect of reducing an electron temperature and increasing electron density. Accordingly, the amount of the generated radicals is increased, a film formation rate is improved, crystallinity of a microcrystalline semiconductor film is improved, and thus the microcrystalline semiconductor film is densified. In order to obtain such an effect, it is necessary to excite the rare gas so as to be placed in a metastable state and therefore it is necessary to generate excited species of the rare gas or apply an electric field sufficient for ionization of the rare gas. For example, when argon is added as the rare gas in addition to a silane gas and a hydrogen gas which are reactive gases, a hydrogen radical increases in number and crystallinity of a microcrystalline semiconductor film can be improved.

For example, an embodiment of the present invention is a method of manufacturing a photoelectric conversion device including a first electrode, a unit cell, and a second electrode over a substrate. The method includes the steps of: forming a plasma region between a first electrode and a second electrode by supplying high-frequency power of 60 MHz or less to the first electrode under a condition where a pressure of a reactive gas in a chamber of a plasma CVD apparatus is set to greater than or equal to 450 Pa and less than or equal to 13332 Pa, preferably, greater than or equal to 450 Pa and less than or equal to 2000 Pa, and a distance between the first electrode and the second electrode of the plasma CVD apparatus is set to greater than or equal to 1 mm and less than or equal to 20 mm, preferably, greater than or equal to 4 mm and less than or equal to 16 mm; forming crystalline deposition precursors in a gas phase including the plasma region; forming a crystal nucleus having a grain size of greater than or equal to 5 nm and less than or equal to 15 nm by depositing the deposition precursors; and forming any of a semiconductor film having a first conductivity type, a semiconductor film effective in photoelectric conversion, and a semiconductor film having a first conductivity type, which are included in the unit cell, by growing a crystal from the crystal nucleus.

Another embodiment of the present invention is a method of manufacturing a photoelectric conversion device including a first electrode, a plurality of unit cells, and a second electrode over a substrate. The method includes the steps of: forming a plasma region between a first electrode and a second electrode by supplying high-frequency power of 60 MHz or less to the first electrode under a condition where a pressure of a reactive gas in a chamber of a plasma CVD apparatus is set to greater than or equal to 450 Pa and less than or equal to 13332 Pa, preferably, greater than or equal to 450 Pa and less than or equal to 2000 Pa, and a distance between the first electrode and the second electrode of the plasma CVD apparatus is set to greater than or equal to 1 mm and less than or equal to 20 mm, preferably, greater than or equal to 4 mm and less than or equal to 16 mm; forming crystalline deposition precursors in a gas phase including the plasma region; forming a crystal nucleus having a grain size of greater than or equal to 5 nm and less than or equal to 15 nm by depositing the deposition precursors; and forming any of a semiconductor film having a first conductivity type, a semiconductor film effective in photoelectric conversion, and a semiconductor film having a first conductivity type, which are included in one of the unit cells, by growing a crystal from the crystal nucleus.

Note that in the case where the projected structure bodies (protruding portions) are provided for the first electrode or the second electrode, a deposition precursor may be generated in such a manner that a reactive gas is supplied through the gas supply port provided on a common plane of the first electrode or the second electrode, or at an apex of the projected structure body or in the vicinity thereof so that the reactive gas flows into a high-density plasma region. Alternatively, a deposition precursor may be generated in such a manner that reactive gases are supplied through a first gas supply port which is provided at the apex of the projected structure body of the first electrode or the second electrode, or the vicinity thereof, and a second gas supply port which is provided on the common plane of the first electrode so that the reactive gases which are supplied through their respective gas supply ports flow through the high-density plasma region.

In the above structure, the electron temperature of the high-density plasma region is reduced and electron density in the high-density plasma region is increased by adding a rare gas to the reactive gas, so that the crystallinity of the microcrystalline semiconductor film can be improved.

The reactive gas supplied through the gas supply port is made to flow into the high-density plasma region, whereby a deposition precursor can be generated in a gas phase, and the reaction can be promoted.

In addition, a structure body is provided on a surface of a flat-plate electrode and the structure body has a shape with a curved surface at the corner, whereby a high-density plasma region can be formed without concentration of an electric field at the corner.

Moreover, collision between deposition precursors which has become nanocrystals does not occur by reducing a distance between the electrodes; thus, an amorphous component is not generated.

As described above, a proportion of amorphous components included in a deposited microcrystalline semiconductor film can be reduced; thus, a dense microcrystalline semiconductor film can be manufactured.

BRIEF DESCRIPTION OF THE DRAWINGS

FIGS. 16A to 16D illustrate a method of manufacturing a photoelectric conversion device.

DETAILED DESCRIPTION OF THE INVENTION

Figure 1A:
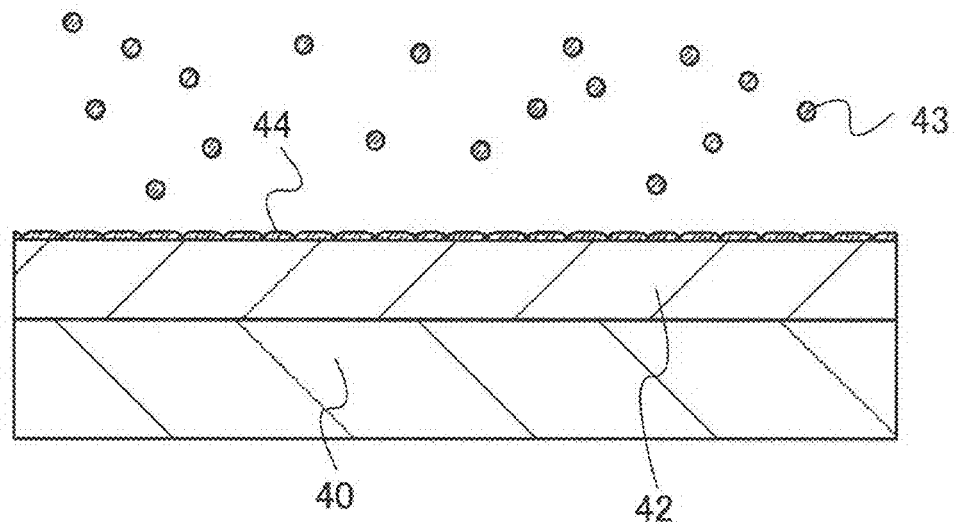
FIGS. 1A and 1B illustrate a method of manufacturing a microcrystalline semiconductor film.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. In addition, an insulating layer is not illustrated in a top view for convenience in some cases. Note that the size, the layer thickness, or the region of each structure illustrated in each drawing is exaggerated for clarity in some cases. Therefore, the present invention is not necessarily limited to such scales illustrated in the drawings.

Embodiment 1

In this embodiment, a method for manufacturing a microcrystalline semiconductor film having high crystallinity is described with reference to FIGS. 1A and 1B, FIG. 2, FIGS. 3A and 3B, and FIG. 4.

Figure 1B:
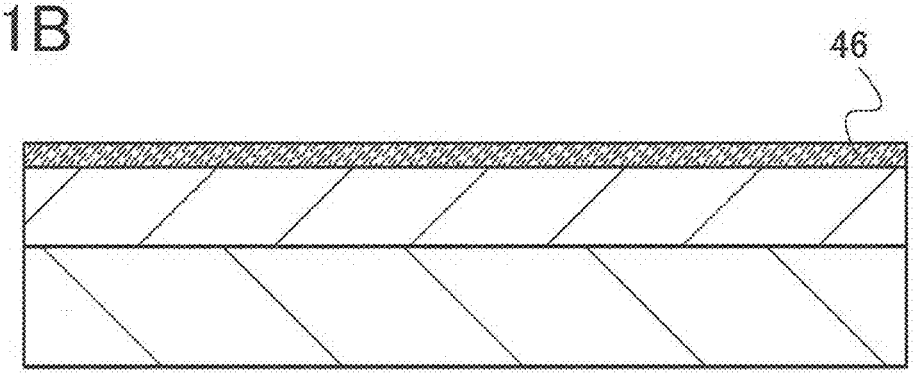

As illustrated in FIG. 1A, in a method for manufacturing a microcrystalline semiconductor film shown in this embodiment, deposition precursors 43 are formed in a gas phase, the deposition precursors 43 are deposited over a base film 42 which is formed over a substrate 40, and crystal nuclei 44 are formed. Next, as illustrated in FIG. 1B, a microcrystalline semiconductor film is formed over the crystal nuclei 44, whereby crystals are grown using the crystal nuclei 44 as nuclei so that a microcrystalline semiconductor film 46 can be formed.

The deposition precursor 43 is formed through reaction of electrons and a source gas in plasma. The pressure in a film formation chamber can be higher than a film formation pressure of 300 Pa for a conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. The deposition precursor, the size of which is several nanometers, is successively reacted with a plurality of radicals; therefore, it can be said that the deposition precursor is a higher-order radical $(SiH_n)_x(n=1, 2, 3)$ which is somewhat well ordered. In the case where the source gas is a deposition gas containing silicon or germanium, the deposition precursor 43 is formed using silicon, germanium, or silicon germanium. Therefore, the deposition precursors 43 deposited over the base film 42 become the crystal nuclei 44. Alternatively, the deposition precursors 43 deposited over the base film 42, which are combined with an active radical which is dissociated in plasma, become the crystal nuclei 44. The crystal nuclei 44, the size of which is 5 nm to 15 nm inclusive, are well ordered because, in a crystal grain, a crystallite which is a fine crystal that can be considered as a single crystal is included. Accordingly, when the active radicals which are dissociated in plasma reach to the crystal nuclei 44, crystals are grown using the crystal nuclei 44 as nuclei; therefore, the microcrystalline semiconductor film 46 having high crystallinity can be formed from the interface between the base film and the crystal nuclei.

In this embodiment, the crystal nuclei 44 can be deposited densely over the base film 42 in such a manner that the pressure of a reaction chamber is set to higher than the film formation pressure for the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. That is, the adjacent crystal nuclei 44 which are in close contact can be deposited over the base film 42. Accordingly, when crystals are grown using the crystal nuclei 44 as nuclei, crystal grains become dense, and an amorphous semiconductor and a low-concentration region between the crystal grains are reduced; therefore, the microcrystalline semiconductor film 46 having high crystallinity can be formed.

Note that the base film 42 is a film having a surface over which the microcrystalline semiconductor film 46 is formed. The substrate 40 and the base film 42 can be used as appropriate. As the base film 42, a conductive film, a semiconductor film to which an impurity element imparting one conductivity type is added, or the like is used.

Here, a plasma CVD apparatus capable of manufacturing the deposition precursors 43 and the crystal nuclei 44 which are features of this embodiment is described with reference to FIG. 2, FIGS. 3A and 3B, and FIG. 4.

Figure 2:
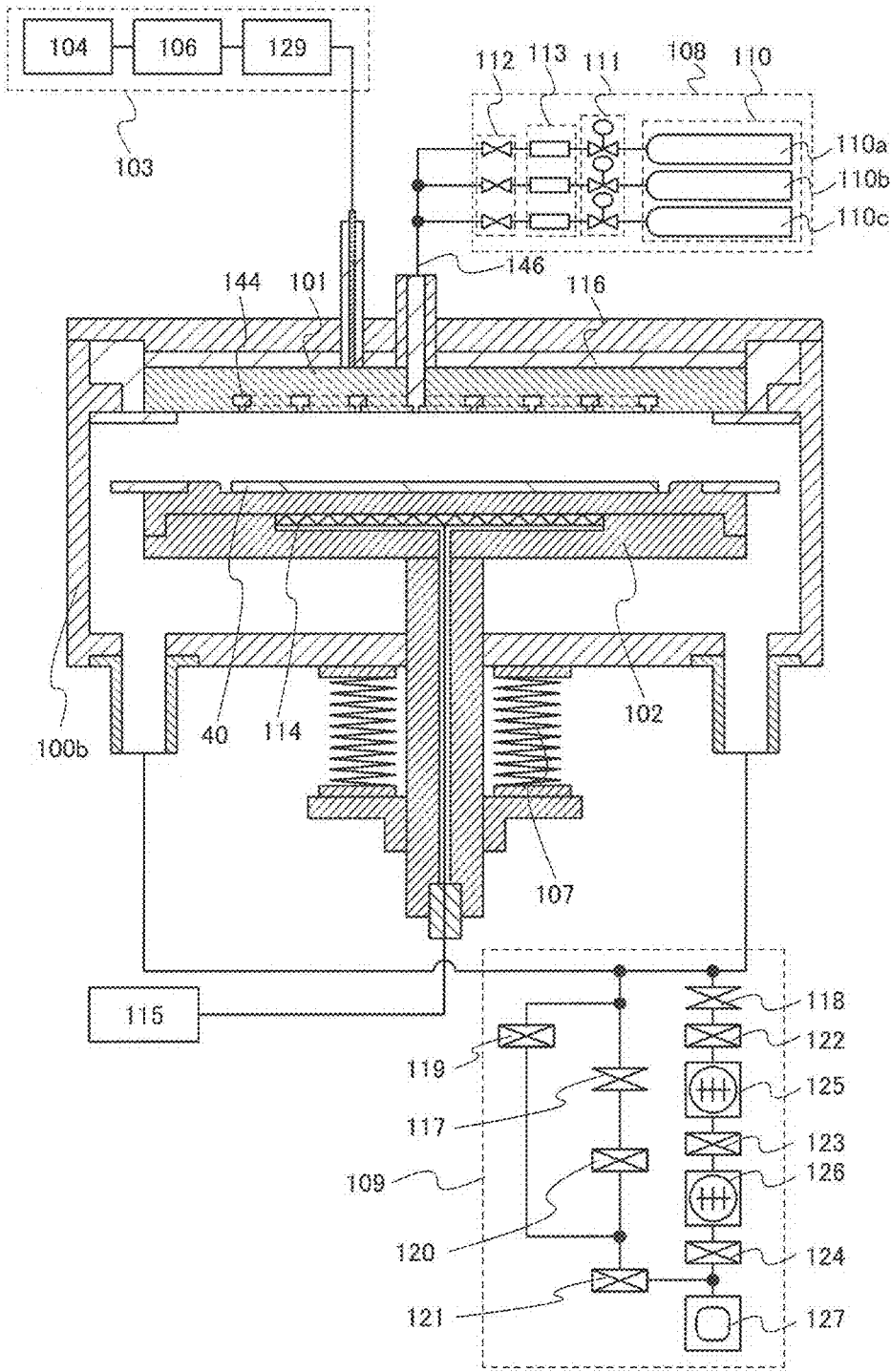
FIG. 2 illustrates an example of a plasma CVD apparatus.

FIG. 2 illustrates a structure of a plasma CVD apparatus. A reaction chamber 100b is formed using a stiff material such as aluminum or stainless steel and has a structure in which the inside of the reaction chamber 100b can be vacuum-evacuated. The reaction chamber 100b in this embodiment is formed using stainless steel in order to increase its mechanical strength, and the inside thereof is coated with aluminum by thermal spraying. In addition, it is preferable that the reaction chamber of the plasma CVD apparatus in this embodiment can be disassembled for maintenance and that the inside of the reaction chamber 100b be regularly recoated with aluminum by thermal spraying. The reaction chamber 100b is provided with a first electrode 101 (also referred to as an upper electrode) and a second electrode 102 (also referred to as a lower electrode) which is opposite to the first electrode 101.

A high-frequency power supply unit 103 is connected to the first electrode 101. The second electrode 102 is grounded, and the substrate 40 can be placed on the second electrode 102. The first electrode 101 is insulated from the reaction chamber 100b by an insulating material 116 so that high-frequency power does not leak. In the case where, for example, a ceramic material is used for the insulating material 116, it is difficult to use a knife-edge-type metal-seal flange for sealing of the upper electrode, and therefore an O-ring seal is preferably used.

Although the first electrode 101 and the second electrode 102 have a capacitively coupled (parallel plate) structure in FIG. 2, an embodiment of the present invention is not limited thereto. Another structure such as an inductively coupled structure or the like may be employed as long as the structure can generate glow discharge plasma in the reaction chamber 100b by supplying high-frequency power.

The first electrode 101 and the second electrode 102 are provided so that each surface is roughly parallel to each other. The first electrode 101 is provided with hollow portions 144 which are connected to a gas supply unit 108. The hollow portions 144 are connected via a gas line 146 to a cylinder 110a of the gas supply unit 108, which is filled with a deposition gas containing silicon or germanium. Thus, the deposition gas containing silicon or germanium is supplied to the reaction chamber 100b through the gas supply ports of the hollow portions 144.

The gas supply unit 108 includes a cylinder 110 filled with gases, a pressure adjusting valve 111, a stop valve 112, a mass flow controller 113, and the like. The gas supply unit 108 includes the cylinder 110a filled with the deposition gas containing silicon or germanium, a cylinder 110b filled with hydrogen, and a cylinder 110c filled with a dilution gas. Note that the cylinder 110c filled with the dilution gas is provided here; however, it is not necessarily required.

As examples of the deposition gas containing silicon or germanium, which fills the cylinder 110a, a silane ($SiH_4$) gas, a disilane ($Si_2H_6$) gas, a germane ($GeH_4$) gas, a digermane ($Ge_2H_6$) gas, and the like are given; however, any other deposition gas may be used.

As examples of the dilution gas which fills the cylinder 110c, rare gases such as argon, xenon, and krypton are given.

A substrate heater 114, the temperature of which is controlled by a heater controller 115, is provided in the second electrode 102. In the case where the substrate heater 114 is provided in the second electrode 102, a thermal conduction heating method is employed. For example, the substrate heater 114 may include a sheathed heater.

The high-frequency power supply unit 103 includes a high-frequency power source 104, a matching box 106, and a high-frequency cut filter 129. High-frequency power supplied from the high-frequency power source 104 is supplied to the first electrode 101.

The high-frequency power source 104 supplies high-frequency power at a frequency of 60 MHz or less. In the case where a large substrate of the seventh or later generation is used as a substrate placed on the second electrode 102, the high-frequency power source 104 preferably supplies high-frequency power at a wavelength of approximately 10 m or more. Typically, high-frequency power at a frequency of 13.56 MHz or less, for example, from 3 MHz to 13.56 MHz inclusive, is preferably supplied. When the high-frequency power source 104 supplies high-frequency power at a frequency in the above range, even if a large substrate of the seventh or later generation is placed on the second electrode 102 and glow discharging is performed, plasma can be generated uniformly without the adverse effect of a surface standing wave; accordingly, a film which is uniform and has good film quality can be formed over an entire surface even in the case of the large substrate.

In addition, when high-frequency power source with a frequency of 13.56 MHz is used for the high-frequency power source 104, a variable capacitor with a capacitance of 10 pF to 100 pF is used for the high-frequency cut filter 129.

By further using a coil for the high-frequency cut filter 129, a parallel resonance circuit using a coil and a variable capacitor may be formed.

An evacuation unit 109 connected to the reaction chamber 100b has a function of vacuum evacuation and a controlling function of controlling the inside of the reaction chamber 100b to be kept at a predetermined pressure in the case where a reactive gas is supplied. The evacuation unit 109 includes butterfly valves 117 and 118, stop valves 119 to 124, turbo molecular pumps 125 and 126, a dry pump 127, and the like. The turbo molecular pump 126 is connected to the dry pump 127 via the stop valve 124.

When the reaction chamber 100b is vacuum evacuated, first, the stop valve 119 and the stop valve 121 for rough vacuum are opened and the reaction chamber 100b is evacuated with the dry pump 127. Then, the stop valve 119 is closed and the butterfly valve 117 and the stop valve 120 are opened for vacuum evacuation. In the case where ultrahigh vacuum evacuation is performed to obtain a pressure lower than $10^{-5}$ Pa in the reaction chamber 100b, the reaction chamber 100b is evacuated with the dry pump, the butterfly valve 117 and the stop valves 120 and 121 are closed, the butterfly valve 118 and the stop valves 122 to 124 are opened, and then vacuum evacuation is performed using the turbo molecular pumps 125 and 126 and the dry pump 127 which are connected in series. In addition, after the vacuum evacuation is performed, the reaction chamber 100b is preferably subjected to heat treatment so that degassing of the inner wall is performed.

A distance (also referred to as a gap) between the first electrode 101 and the second electrode 102 can be adjusted as appropriate. The gap between the electrodes can be adjusted in such a manner that the height of the second electrode 102 is varied in the reaction chamber 100b. By using a bellows 107, the gap between the electrodes can be adjusted with the reaction chamber 100b kept in a vacuum.

Figure 3A:
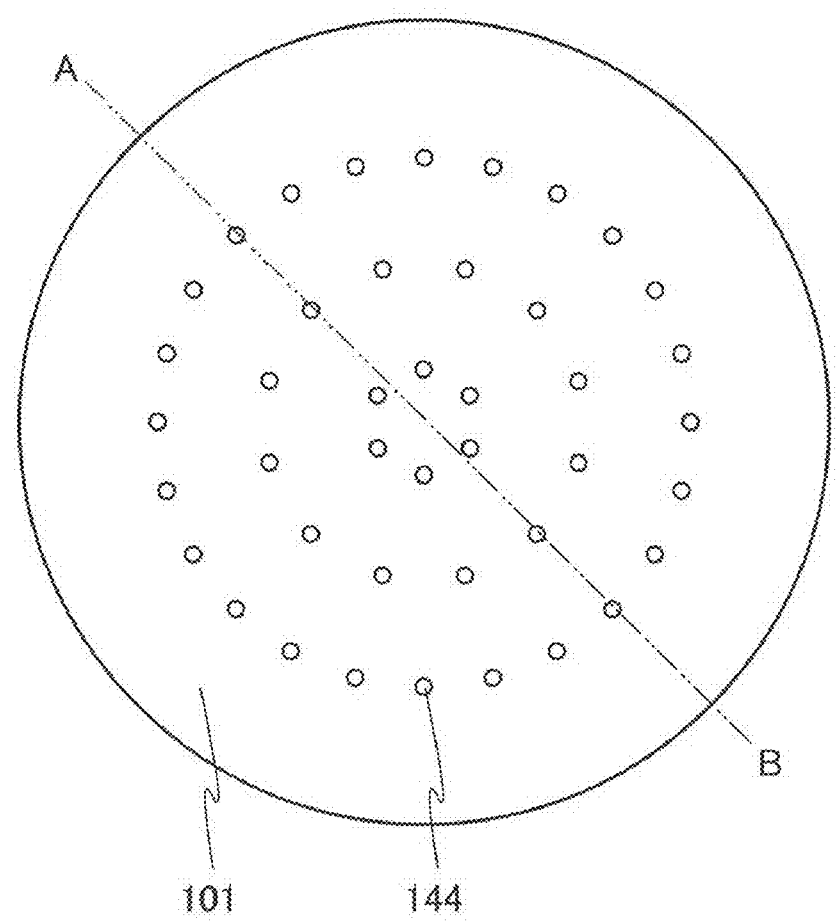
FIGS. 3A and 3B illustrate a shape of an upper electrode of the plasma CVD apparatus.

Here, one mode of the shape of the first electrode 101 is described with reference to FIGS. 3A and 3B. FIG. 3A is a plan view of the first electrode 101 seen from the second electrode 102 side, and FIG. 3B is a cross-sectional view taken along A-B in FIG. 3A.

Figure 3B:
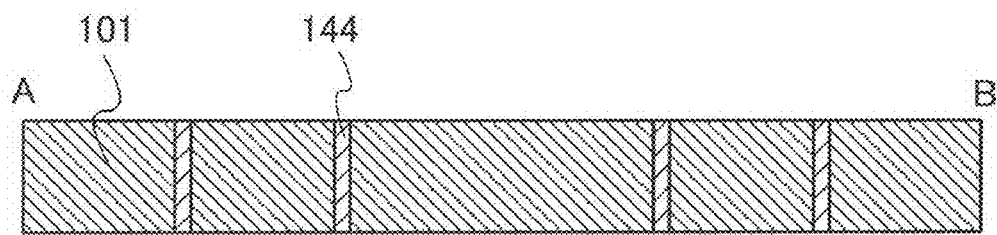

As illustrated in FIGS. 3A and 3B, the gas supply ports of the hollow portions 144 are arranged regularly, preferably, at regular intervals in the first electrode 101. The diameter of the gas supply port may be uniform or different in the entire surface of the first electrode 101. Note that the arrangements of the gas supply ports in the figures are merely an example, and one embodiment of the disclosed invention should not be construed as being limited to this example. For example, the gas supply ports may be provided only in the center of the first electrode 101.

Figure 4:
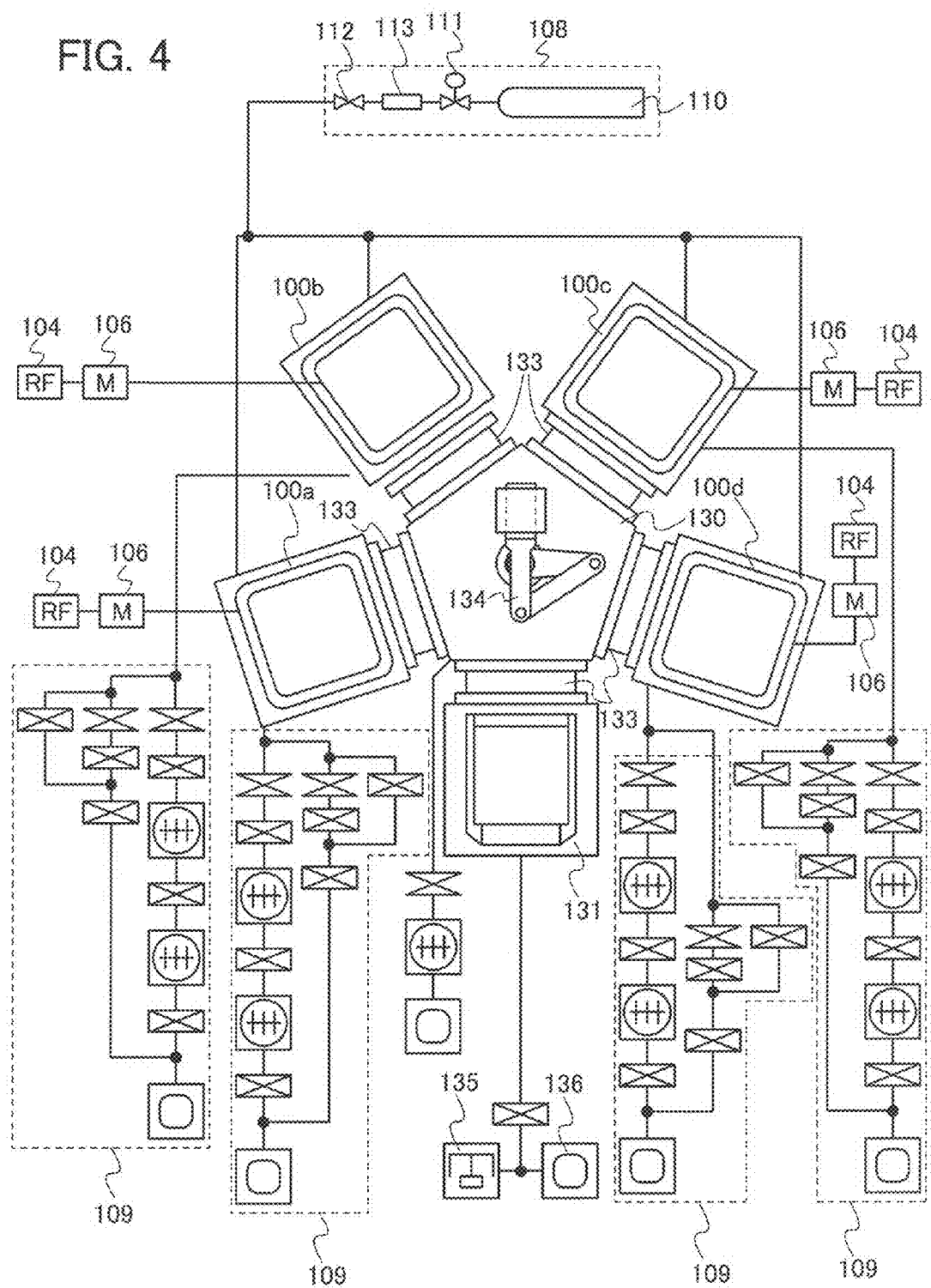
FIG. 4 illustrates an example of a film formation apparatus.

FIG. 4 is a schematic diagram illustrating one mode of a multi-chamber plasma CVD apparatus provided with a plurality of reaction chambers. This apparatus includes a common chamber 130, a load/unload chamber 131, a first reaction chamber 100a, the second reaction chamber 100b, a third reaction chamber 100c, and a fourth reaction chamber 100d. This multi-chamber plasma CVD apparatus is a single-wafer processing type in which a substrate set in a cassette in the load/unload chamber 131 is carried in and out of each reaction chamber by a transport mechanism 134 of the common chamber 130. Gate valves 133 are provided between the common chamber 130 and each reaction chamber so that treatments conducted in the reaction chambers do not interfere with each other.

The reaction chambers are separately used for forming different kinds of thin films. Needless to say, the number of the reaction chambers is not limited to four and can be increased or decreased as needed. One film may be formed in one reaction chamber, or a plurality of films may be formed in one reaction chamber.

The evacuation unit 109 is connected to each reaction chamber. The evacuation unit is not limited to a combination of the vacuum pumps illustrated in FIG. 2 and FIG. 4, and another vacuum pump can be used as long as the vacuum pump can perform evacuation to a degree of vacuum within the range of approximately $10^{-5}$ Pa to $10^{-1}$ Pa.

In addition to a dry pump 136, a cryopump 135 that can perform ultra-high vacuum evacuation may be connected to the load/unload chamber 131. By using the cryopump 135, the load/unload chamber 131 can be evacuated to an ultra-high vacuum of a pressure lower than $10^{-5}$ Pa in the load/unload chamber 131 can be obtained, and the concentration of impurities contained in a film deposited on a substrate in the reaction chamber can be reduced. Further, the pumping speed of the cryopump 135 is higher than that of either the turbo molecular pump or the dry pump; therefore, by connecting the cryopump 135 to the load/unload chamber 131 that is opened and closed frequently, the throughput can be increased.

The gas supply unit 108 includes the cylinders 110 filled with gases, the pressure adjusting valve 111, the stop valve 112, the mass flow controller 113, and the like. Although not illustrated here, the cylinders filled with gases includes a cylinder filled with a deposition gas containing silicon or germanium, a cylinder filled with hydrogen, the cylinder filled with a dilution gas, a cylinder filled with a reactive gas (e.g., an oxidizing gas, a nitriding gas, or a hydrogen gas), a cylinder filled with gases containing an impurity element imparting one conductivity type, and the like.

A high-frequency power supply unit for generating plasma is connected to each reaction chamber. The high-frequency power supply unit includes at least the high-frequency power source 104 and the matching box 106.

The reaction chambers can be separately used for forming different kinds of thin films. Since the optimal deposition temperatures vary between thin films, the reaction chambers are separately used so that the deposition temperatures for films to be formed can be separately controlled easily. In addition, the same kind of films can be deposited repeatedly; therefore, influence of residual impurities due to a film which has been formed can be eliminated.

In the reaction chamber 100b of the plasma CVD apparatus illustrated in FIG. 2, a mean free path of a molecule is shortened, a probability that an electron collides with a gas molecule in plasma is increased, and a reaction probability is enhanced in the following manner: the pressure of the film formation chamber is set to higher than the film formation pressure for the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa; and hydrogen and a deposition gas containing silicon or germanium is introduced into the reaction chamber as a source gas to supply high-frequency power to the first electrode 101 so that glow discharge is generated. Thus, an active radical is easily generated in plasma. In particular, short-life active radicals are generated in a region where plasma density is high and are reacted in a gas phase, whereby nuclei are formed. When nuclei are formed, successive reaction proceeds in a gas phase, which promotes a deposition precursor of nanometer size. Such discharge at a pressure higher than the film formation pressure for the conventional microcrystalline semiconductor film is easily generated in the case where a distance between the first electrode 101 and the second electrode 102 is short, which is typically greater than or equal to 1 mm and less than or equal to 20 mm, preferably, greater than or equal to 4 mm and less than or equal to 16 mm, further preferably, greater than or equal to 5 mm and less than or equal to 10 mm. Note that, here, the distance between the first electrode 101 and the second electrode 102 refers to an interval between the first electrode 101 and the second electrode 102.

When the nucleus of the deposition precursor is generated, an active radical adheres to the nucleus and the deposition precursor is grown. A radical necessary for generation of the nucleus is consumed when the nucleus is grown; therefore, generation of another nucleus is suppressed. Thus, as well as the pressure of the reaction chamber, time for supply of electric power (e.g., a pulse width and a pulse frequency in pulse wave power) to the first electrode 101, a gas flow rate, and exhaust velocity of gas are controlled, whereby the size and the generation amount of the deposition precursors can be controlled.

The composition of the deposition precursor can be controlled by selecting the gas to be supplied because radicals generated in plasma are different depending on kinds of gas. Therefore, the deposition precursor having a multilayer structure can also be generated by changing the kind of deposition gas during growth of the deposition precursor. Note that in the case where a deposition gas containing silicon or germanium is used as the source gas, the deposition precursor is formed using silicon, germanium, or silicon germanium.

Since a deposition precursor is likely to be charged negatively in plasma, the deposition precursor has a property in which cohesion of deposition precursors is suppressed by Coulomb force. Therefore, in accordance with this embodiment, a deposition precursor which is substantially monodispersed can be obtained with high density.

The temperature of a deposition precursor as well as kinds of radical that contributes to growth is important for the structure of the deposition precursor. The temperature of a deposition precursor is determined under the influence of the following: release or absorption of incident ions on a surface thereof (a surface of the deposition precursor), kinetic energy of electrons, or energy due to chemical reaction on the surface; heating or cooling due to collision of molecules of a neutral gas; or the like.

For example, in the case where a deposition precursor of silicon is generated, a crystalline structure can be obtained by diluting silane ($SiH_4$) with hydrogen. It is considered that this mechanism is similar to that of surface reaction that occurs in deposition of a microcrystalline silicon film, and that reaction between hydrogen and a radical which is generated after dissociation of silane is mainly contributed to generation of the deposition precursor of silicon, which has a crystalline structure.

Accordingly, well-ordered deposition precursors formed in a gas phase are deposited over a surface of a substrate to be crystal nuclei so that the crystal nuclei can be used as nuclei of crystal growth over the substrate. In addition, a crystalline deposition precursor can be included in a film to be deposited. Further, when a microcrystalline semiconductor film is deposited over crystal nuclei, crystals are grown from an interface between a base film and crystal nuclei using well-ordered crystal nuclei as nuclei. Thus, a microcrystalline semiconductor film having high crystallinity can be formed from the interface between the base film and the crystal nuclei. Furthermore, the generation rate of a deposition precursor is increased when the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. Accordingly, the adjacent crystal nuclei 44 which are in close contact can be deposited over the base film 42, and an amorphous semiconductor and a low-concentration region (also referred to as a cavity) between the crystal grains are reduced; therefore, the film formation rate of the microcrystalline semiconductor film having high crystallinity can be improved.

Embodiment 2

In this embodiment, a structure applicable to the first electrode of the plasma CVD apparatus shown in Embodiment 1 is described with reference to FIG. 5, FIGS. 6A and 6B, FIGS. 7A and 7B, FIGS. 8A and 8B, FIGS. 9A and 9B, and FIGS. 10A to 10D.

Figure 5:
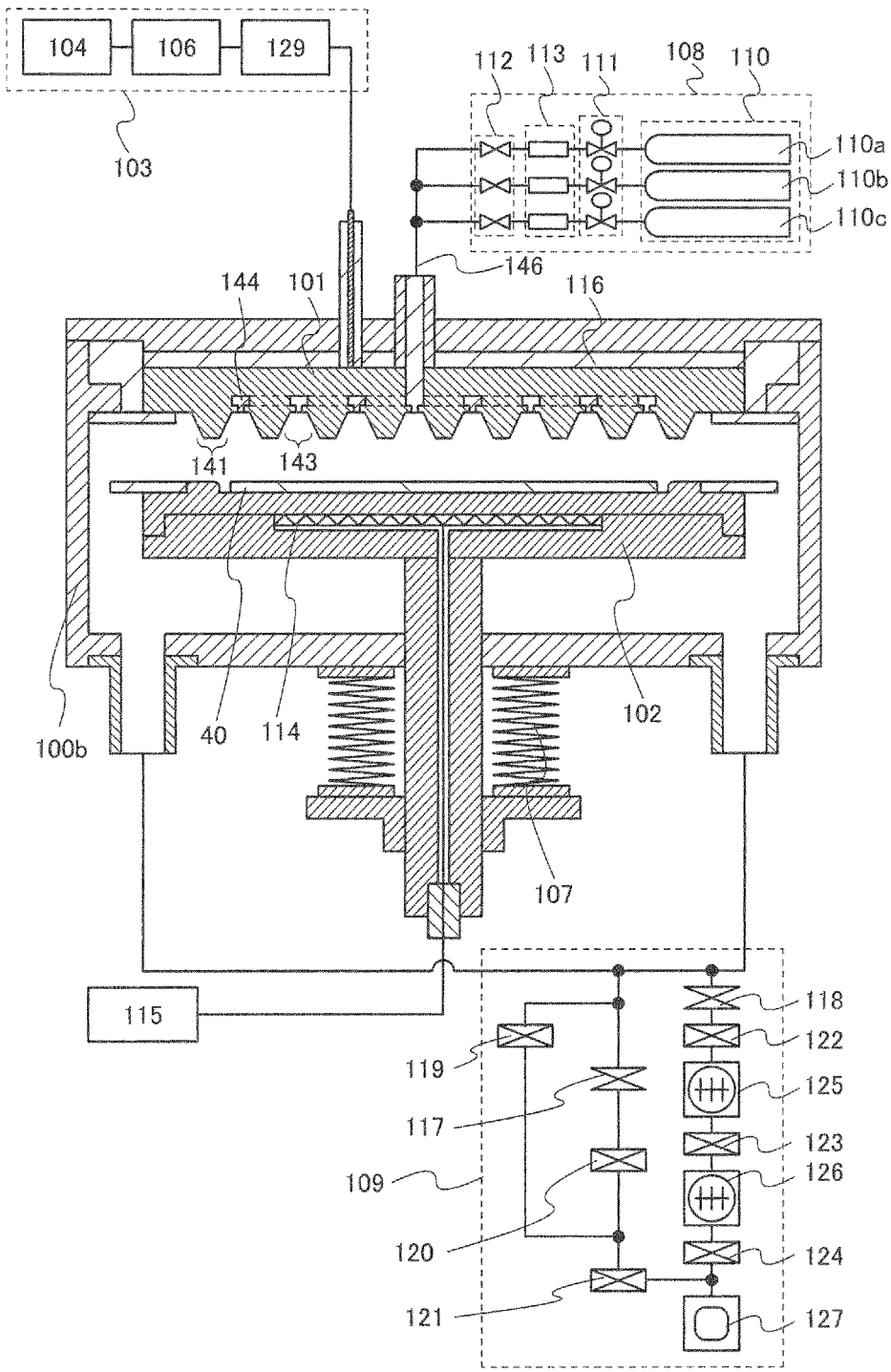
FIG. 5 illustrates an example of a plasma CVD apparatus.

In a structure of the reaction chamber of the plasma CVD apparatus illustrated in FIG. 5, the first electrode 101 is an electrode that is projected and depressed by having projected portions 141 and depressed portions 143 arranged regularly, preferably at regular intervals. In other words, the projected portions 141 formed using projected structure bodies are arranged regularly, preferably at regular intervals. The hollow portions 144 connected to the gas supply unit 108 are provided in the depressed portions 143 of the first electrode 101. In other words, the depressed portions 143 form a common plane where gas supply ports are provided. Here, the region having the gas supply port near a surface of the second electrode 102 is regarded as the projected portion 141, and the region having the gas supply port distant from the surface of the second electrode 102 is regarded as the depressed portion 143.

The hollow portions 144 are connected to the cylinder 110a of the gas supply unit 108 through the gas line 146, which is filled with a deposition gas containing silicon or germanium. Therefore, the deposition gas containing silicon or germanium is supplied to the reaction chamber 100b through the gas supply ports of the hollow portions 144 provided in the depressed portions 143.

Figure 6A:
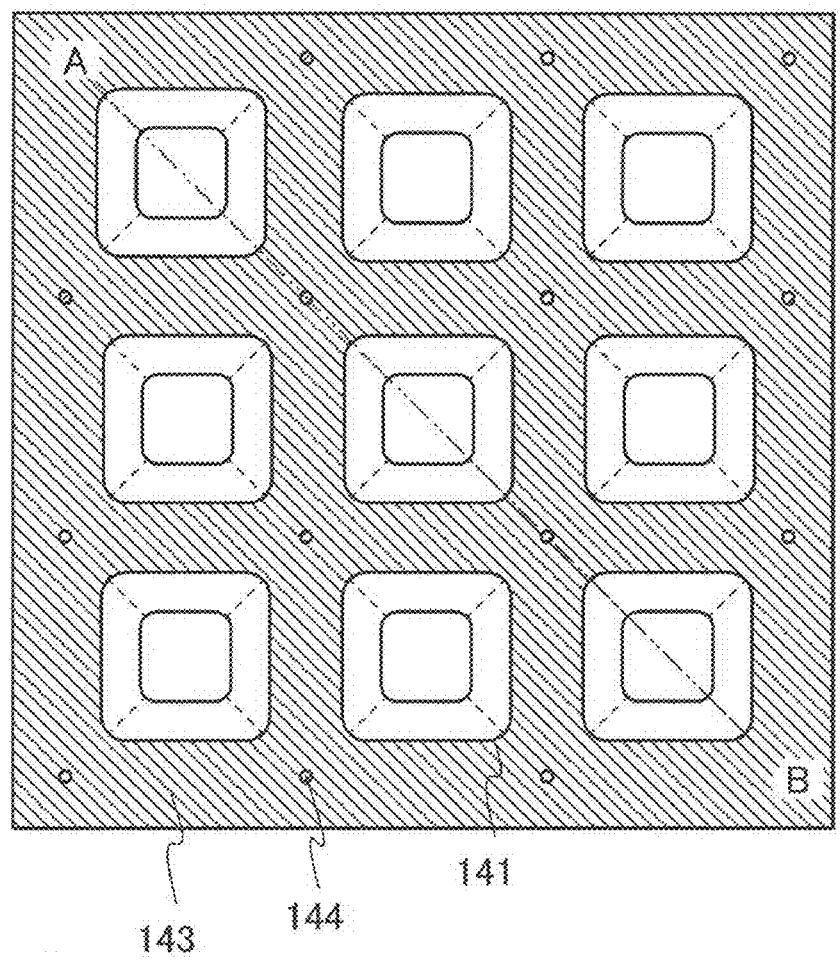
FIGS. 6A and 6B illustrate a shape of an upper electrode of the plasma CVD apparatus.
Figure 6B:
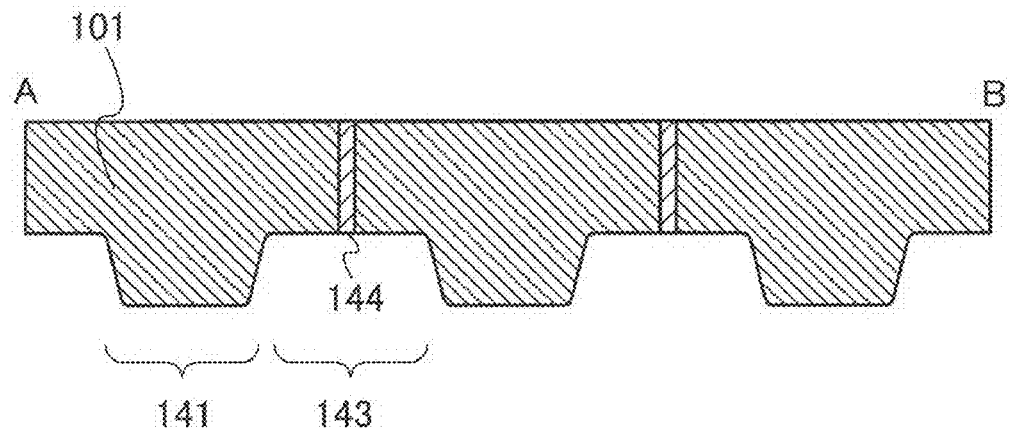
Figure 7A:
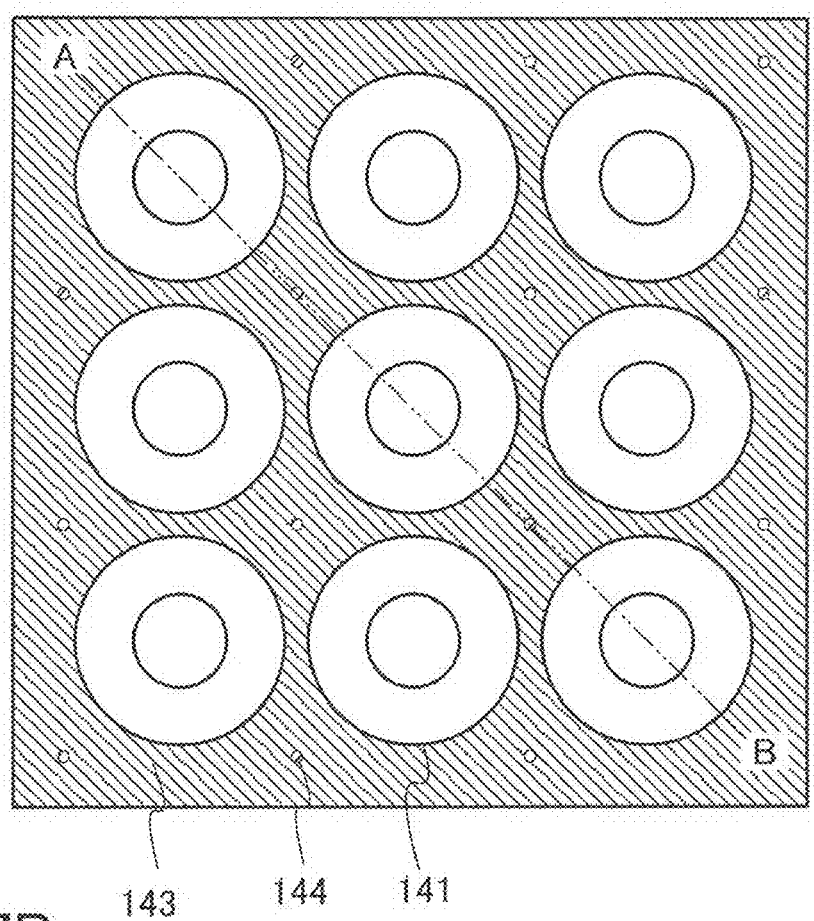
FIGS. 7A and 7B illustrate a shape of an upper electrode of the plasma CVD apparatus.
Figure 7B:
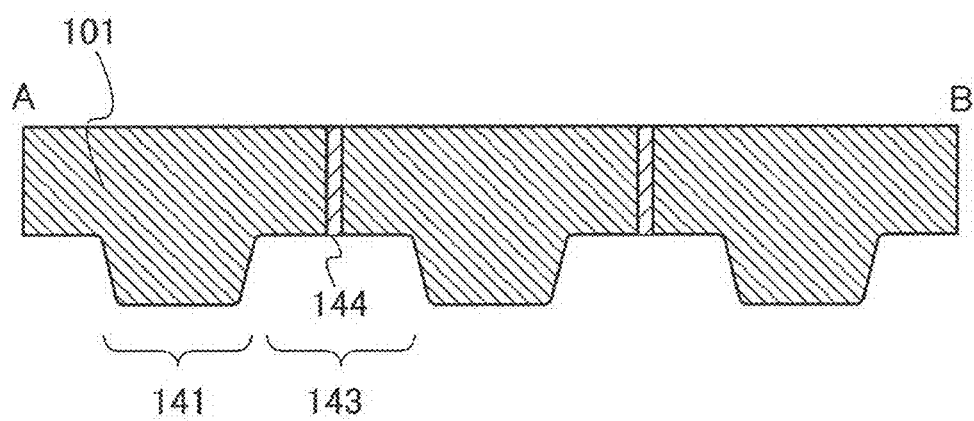

Here, examples of the shape of the first electrode 101 are described with reference to FIGS. 6A and 6B and FIGS. 7A and 7B. FIG. 6A and FIG. 7A are plan views of the first electrode 101 seen from the second electrode 102 side. FIGS. 6B and 7B are cross-sectional views taken along line A-B in FIG. 6A and FIG. 7A. Note that in FIG. 6A and FIG. 7A, regions which are depressed (that is, depressed portions) are shown in fine hatching for clear illustration of the state of the projection and depression.

As illustrated in FIGS. 6A and 6B, the gas supply ports of the hollow portions 144 formed in the depressed portions 143 are provided regularly, preferably at regular intervals. The gas supply ports of the hollow portions 144 are provided in the depressed portions 143. The plurality of projected portions 141 are separated from one another, and the depressed portions 143 form a continuous plane (common plane). In other words, there are projected structure bodies provided so as to project over the common plane where the gas supply ports are provided, and the projected structure bodies are each isolated. Here, the projected portions 141 each have the shape of a truncated quadrangular pyramid. Note that the shape of the projected portions 141 is not limited thereto and may be a truncated triangular pyramid, a truncated pentagonal pyramid, a truncated hexagonal pyramid, or any other truncated polygonal pyramid as appropriate. Preferably, an edge and a corner of the projected portion 141 are roundly chamfered to form a truncated polygonal pyramid with the corners rounded. When the rounded portions of the edges and corners of the projected portion 141 and the depressed portions 143 are chamfered, overconcentration of an electric field can be reduced. Accordingly, local arc discharge can be suppressed, leading to less generation of particles.

As illustrated in FIGS. 7A and 7B, the projected portion 141 may alternatively have the shape of a truncated cone. Further, the gas supply ports of the hollow portions 144 are provided in the depressed portions 143. Note that the rounded portion of the edge of the projected portion 141 is preferably chamfered to form a truncated cone with the corners rounded. When the projected portions 141 each have the shape of a truncated cone and the rounded portions of the edges of the projected portions 141 and the depressed portions 143 are chamfered, overconcentration of an electric field can be reduced. Accordingly, local arc discharge can be suppressed, leading to less generation of particles.

Figure 8A:
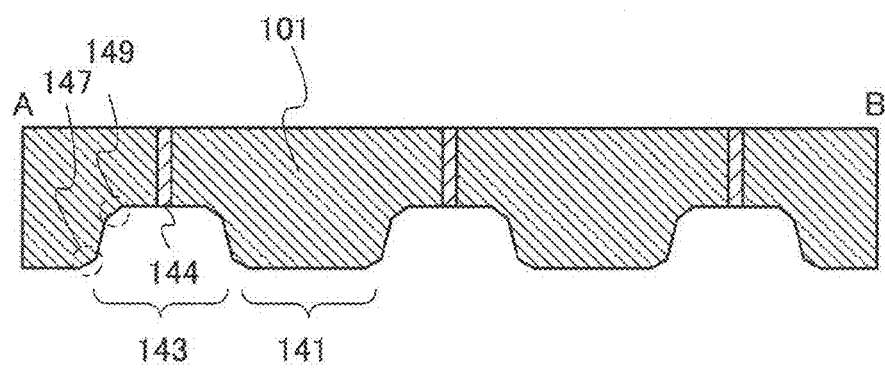
FIGS. 8A and 8B illustrate a shape of an upper electrode of the plasma CVD apparatus.

Although the projected portions 141 each have the shape of the polygonal pyramid or a truncated cone with the corners rounded in FIGS. 6A and 6B and FIGS. 7A and 7B, the edge and corner of the truncated polygonal pyramid or truncated cone can be chamfered without being rounded as illustrated in FIG. 8A. Typically, the projected portion 141 can be tapered so that a corner 147 can be chamfered. Further, the depressed portion 143 can be tapered so that a corner 149 can be chamfered. When the corners 147 and 149 are chamfered in the projected portion 141 and the depressed portion 143, concentration of an electric field at these portions can be reduced, leading to less generation of particles.

Figure 8B:
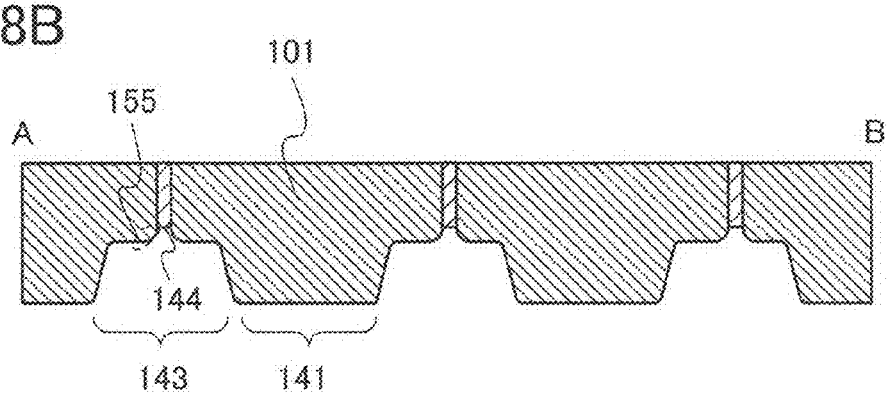

Further, in the depressed portion 143 illustrated in FIGS. 6A and 6B and FIGS. 7A and 7B, an edge and a corner 155 in the periphery of the gas supply port of the hollow portion 144 may be rounded as illustrated in FIG. 8B. The periphery of the gas supply port of the hollow portion 144 may be chamfered without being rounded, although not illustrated. Accordingly, concentration of an electric field in the periphery of the gas supply port can be reduced, leading to less generation of particles.

Figure 10A:
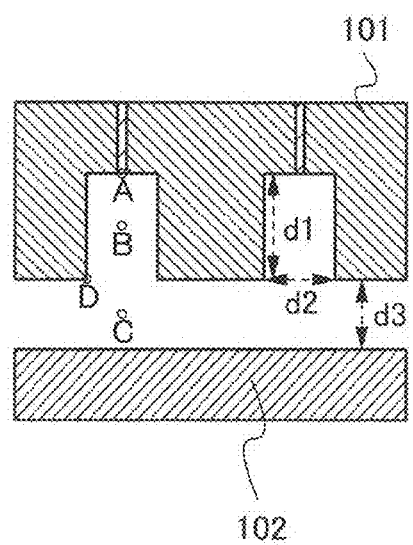
FIGS. 10A to 10D each illustrate the intensity of plasma in the plasma CVD apparatus.
Figure 10B:
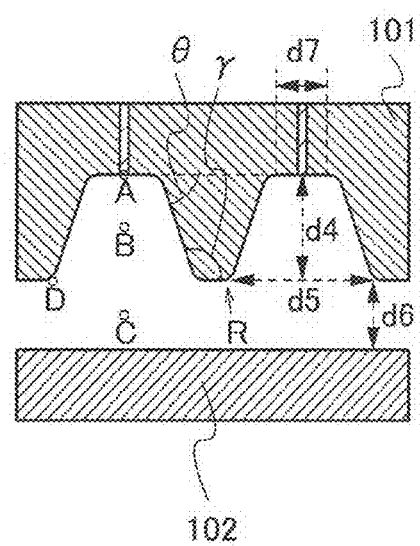
Figure 10C:
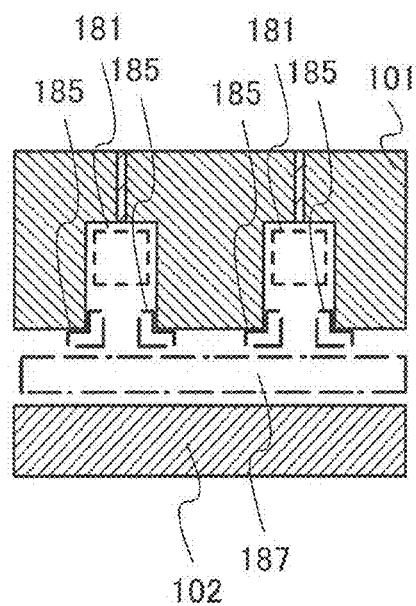
Figure 10D:
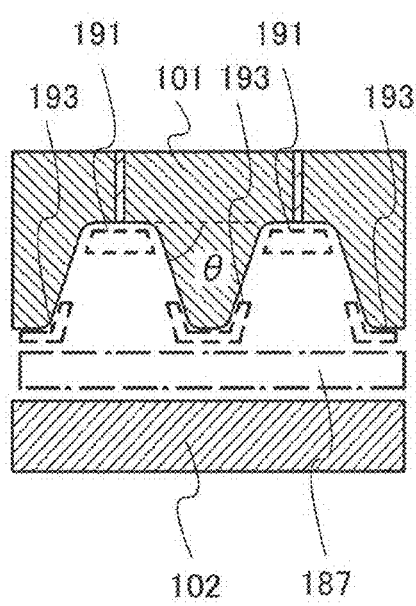

Here, a cross-sectional shape of the first electrode 101 and electric field intensity are described using FIGS. 10A to 10D. FIGS. 10A and 10B each show the cross-sectional shape of the first electrode 101 used for calculation. FIGS. 10C and 10D each show the electric field intensities calculated with an electric field simulator.

FIG. 10A illustrates the shape (first shape) in which a side surface of the projected portion of the first electrode 101 is perpendicular to a surface of the depressed portion. FIG. 10B illustrates the shape (second shape) in which the cross-sectional shape of the projected portion of the first electrode 101 is tapered: when the angle between the side surface of the projected portion of the first electrode 101 and the surface of the depressed portion in the projected portion is θ and the angle between a surface of an apex and side surface of the projected portion is γ, θ is less than 90° and γ is more than 90°. In the case where the cross section of the projected portion is tapered (in the case of FIG. 10B), the cross-sectional area monotonically decreases toward the apex.

In FIG. 10A, the depth of the depressed portion, d1, is 40 mm, the distance between adjacent projected portions, d2, is 20 mm, and the distance between the first electrode 101 and the second electrode 102, d3, is 20 mm.

In FIG. 10B, the depth of the depressed portion, d4, is 40 mm, the distance between the apexes of adjacent projected portions on the second electrode 102 side, d5, is 60 mm, and the distance between the first electrode 101 and the second electrode 102, d6, is 20 mm. Note that the diameter of the plane on the depressed portion where the gas supply ports are formed, d7, is 20 mm. Further, the curvature radius of the edge and corner of the projected portion, R, is 10 mm.

Table 1 shows the results of the calculation of the electric field intensities in the vicinity of the gas supply port, A, the vicinity of the center of the depressed portion, B, the vicinity of the second electrode 102 over the depressed portion, C, and the close vicinity of the projected portion in the first electrode 101, D, which are illustrated in each of FIGS. 10A and 10B. In Table 1, the electric field intensity in the vicinity of the projected portion in the first electrode 101 illustrated in FIG. 10A, which is denoted by D, is set to 1, and the electric field intensities in the other regions are normalized. At this time, the frequency of power supplied to the first electrode 101 is 13.56 MHz.

TABLE 1

|  | A | B | C | D |
|---|---|---|---|---|
| First Shape | 0.0006 | 0.01 | 0.6 | 1 |
| Second Shape | 0.01 | 0.1 | 0.6 | 0.9 |

FIG. 10C shows distribution of the electric field intensities calculated from FIG. 10A. FIG. 10D shows distribution of the electric field intensities calculated from FIG. 10B.

In FIG. 10C, regions 181 having an extremely low electric field are formed in the vicinity of the surfaces of the depressed portion between the adjacent projected portions (the vicinity of A), while regions 185 having a high electric field are formed between the projected portion and plasma 187 (the vicinity of the projected portion of the first electrode 101 (the vicinity of D)).

In contrast, regions 191 having a low electric field are formed in the depressed portions and regions 193 having a moderate electric field are formed in the vicinity of the surfaces of the apexes of the adjacent projected portions in FIG. 10D, because the more electric fields spread to the surface of the depressed portion as the taper angle θ decreases.

Comparison between FIGS. 10C and 10D indicate that the shape illustrated in FIG. 10B allows a decrease in the electric field at the apex of the projected portion, especially at the edge and corner of the projected portion, thereby reducing plasma damage to the surface of the substrate 40 and reducing generation of particles which is caused by arc discharge. Further, as the region of the surface of the apex of the projected portion is decreased more in size, a region in which the density of plasma is higher can be formed in the vicinity of the apex of the projected portion.

Since the first electrode shown in this embodiment has the projected portions 141 and the depressed portions 143, a high-density plasma region can be formed at the apex of the projected portion 141. Thus, in the high-density plasma region, reactivity can be increased to promote generation of the nuclei and the deposition precursors. Accordingly, as in Embodiment 1, well-ordered deposition precursors formed in a gas phase are deposited over a surface of a substrate to be crystal nuclei so that the crystal nuclei can be used as nuclei of crystal growth over the substrate. In addition, a crystalline deposition precursor can be included in a film to be deposited. Further, deposited over crystal nuclei, crystals are grown from an interface between a base film and crystal nuclei using well-ordered crystal nuclei as nuclei. Thus, a microcrystalline semiconductor film having high crystallinity can be formed from the interface between the base film and the crystal nuclei. Furthermore, the generation rate of a deposition precursor is increased in such a manner that a high-density plasma region is formed in the vicinity of the projected portions, and the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. Accordingly, the adjacent crystal nuclei 44 which are in close contact can be deposited over the base film 42, and an amorphous semiconductor and a low-concentration region (also referred to as a cavity) between the crystal grains are reduced; therefore, the film formation rate of the microcrystalline semiconductor film having high crystallinity can be improved.

Embodiment 3

Figure 9A:
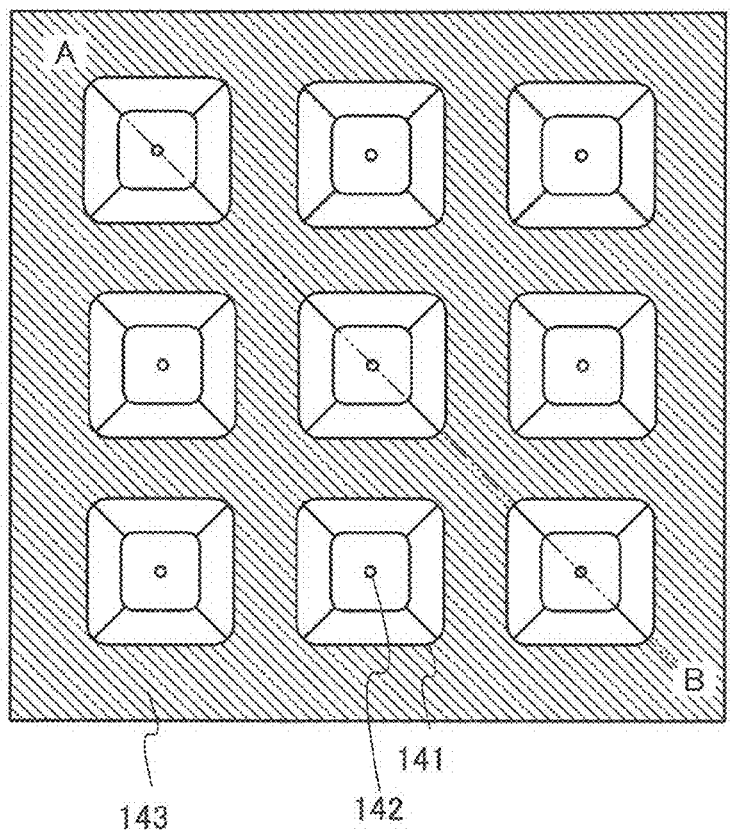
FIGS. 9A and 9B illustrate a shape of an upper electrode of the plasma CVD apparatus.
Figure 9B:
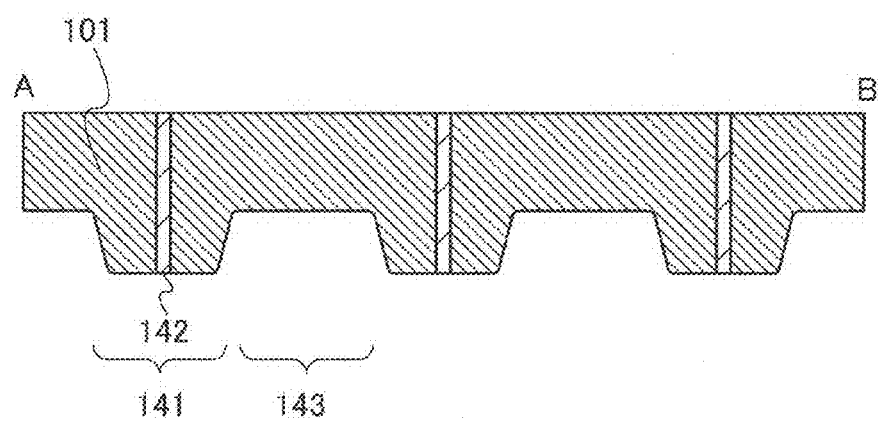

In this embodiment, a structure applicable to the first electrode of the plasma CVD apparatus shown in Embodiment 1 is described with reference to FIGS. 9A and 9B. FIG. 9A is a plan view of the first electrode 101 seen from the second electrode 102 side. FIG. 9B is a cross-sectional view taken along A-B in FIG. 9A. Note that in FIG. 9A, regions which are depressed (that is, depressed portions) are shown in fine hatching for clear illustration of the state of the projection and depression.

As illustrated in FIGS. 9A and 9B, gas supply ports of hollow portions 142 formed in the projected portions 141 are provided regularly, preferably at regular intervals. Further, as illustrated in FIG. 9B, the gas supply ports of the hollow portions 142 are provided in the projected portions 141. The plurality of projected portions 141 are separated from one another, and the depressed portions 143 form a continuous plane (common plane). Here, the projected portions 141 each have the shape of a truncated quadrangular pyramid. Note that the shape of the projected portions 141 is not limited thereto and may be a truncated triangular pyramid, a truncated pentagonal pyramid, a truncated hexagonal pyramid, or any other truncated polygonal pyramid as appropriate. Preferably, rounded portions of the edge and corner of the projected portion 141 are chamfered to form a truncated polygonal pyramid with the corners rounded. The projected portion 141 may alternatively have the shape of a truncated cone. The rounded portion of the edge of the projected portion 141 is preferably chamfered to form a truncated cone with the corners rounded.

Since the high-density plasma region is formed in the apex of the projected portion 141 by glow discharge, reaction of the source gas introduced into the reaction chamber through the gas supply port of the projected portion 141 is further promoted. Accordingly, generation of the deposition precursor 43 proceeds, whereby a larger number of crystal nuclei 44 can be densely deposited over the base film.

Embodiment 4

In this embodiment, a structure applicable to the first electrode of the plasma CVD apparatus shown in Embodiment 1 is described with reference to FIG. 11, FIG. 12, FIGS. 13A and 13B, FIGS. 14A and 14B, and FIGS. 15A and 15B.

Figure 11:
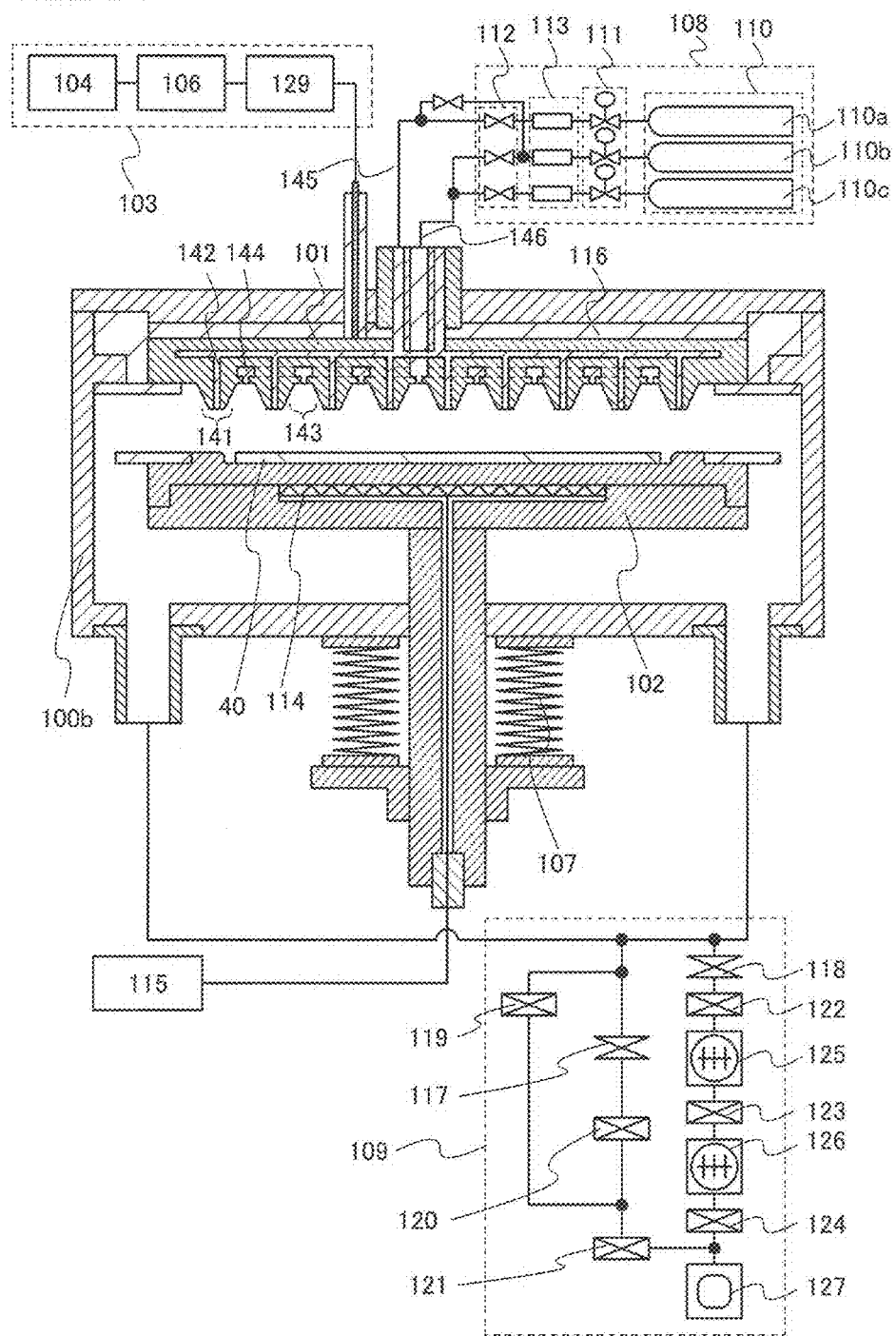
FIG. 11 illustrates an example of a plasma CVD apparatus.

In a structure of the reaction chamber of the plasma CVD apparatus illustrated in FIG. 11, the first electrode 101 is an electrode that is projected and depressed by having the projected portions 141 and the depressed portions 143 arranged regularly, preferably at regular intervals. In other words, the projected portions 141 formed using projected structure bodies are arranged regularly, preferably at regular intervals. Further, the hollow portions 142 connected to the gas supply unit 108 are provided in the projected portions 141 of the first electrode 101, and the hollow portions 144 connected to the gas supply unit 108 are provided in the depressed portion 143 of the first electrode 101. In other words, the depressed portions 143 form a common plane where the gas supply ports are provided. In such a structure, the kind of gas supplied to the reaction chamber 100b through the projected portion 141 can be different from the kind of gas supplied to the reaction chamber 100b through the depressed portion 143. Here, the region having the gas supply port near a surface of the second electrode 102 is regarded as the projected portion 141, and the region having the gas supply port distant from the surface of the second electrode 102 is regarded as the depressed portion 143.

Here, the kinds of gas supplied through the hollow portions 142 and 144 may be determined as appropriate. A structure in which a deposition gas is supplied through the hollow portion 142 and a hydrogen gas is supplied through the hollow portion 144 may be employed, for example. Alternatively, a structure in which a hydrogen gas is supplied through the hollow portion 142 and a deposition gas is supplied through the hollow portion 144 may be employed. Further alternatively, a structure in which a mixed gas of a deposition gas and a hydrogen gas is supplied through the hollow portion 142 and a deposition gas is supplied through the hollow portion 144 may be employed. Alternatively, a structure in which a deposition gas is supplied through the hollow portion 142 and a mixed gas of a deposition gas and a hydrogen gas is supplied through the hollow portion 144 may be employed. Still alternatively, a structure in which a mixed gas of a deposition gas and a hydrogen gas is supplied through the hollow portion 142 and a hydrogen gas is supplied through the hollow portion 144 may be employed. It is the most preferable that a hydrogen gas be supplied through the hollow portion 142 and a mixed gas of a deposition gas and a hydrogen gas be supplied through the hollow portion 144. By supplying a hydrogen gas through the hollow portion 142 and a mixed gas of a deposition gas and a hydrogen gas through the hollow portion 144, crystallinity of a microcrystalline semiconductor film to be formed can be improved.

Note that the flow rate of a gas may be varied during film formation. For instance, the flow rate of a deposition gas is increased at the initial stage of film formation and the dilution rate is raised at the later stage of the film formation, whereby the crystallinity can be improved.

Figure 12:
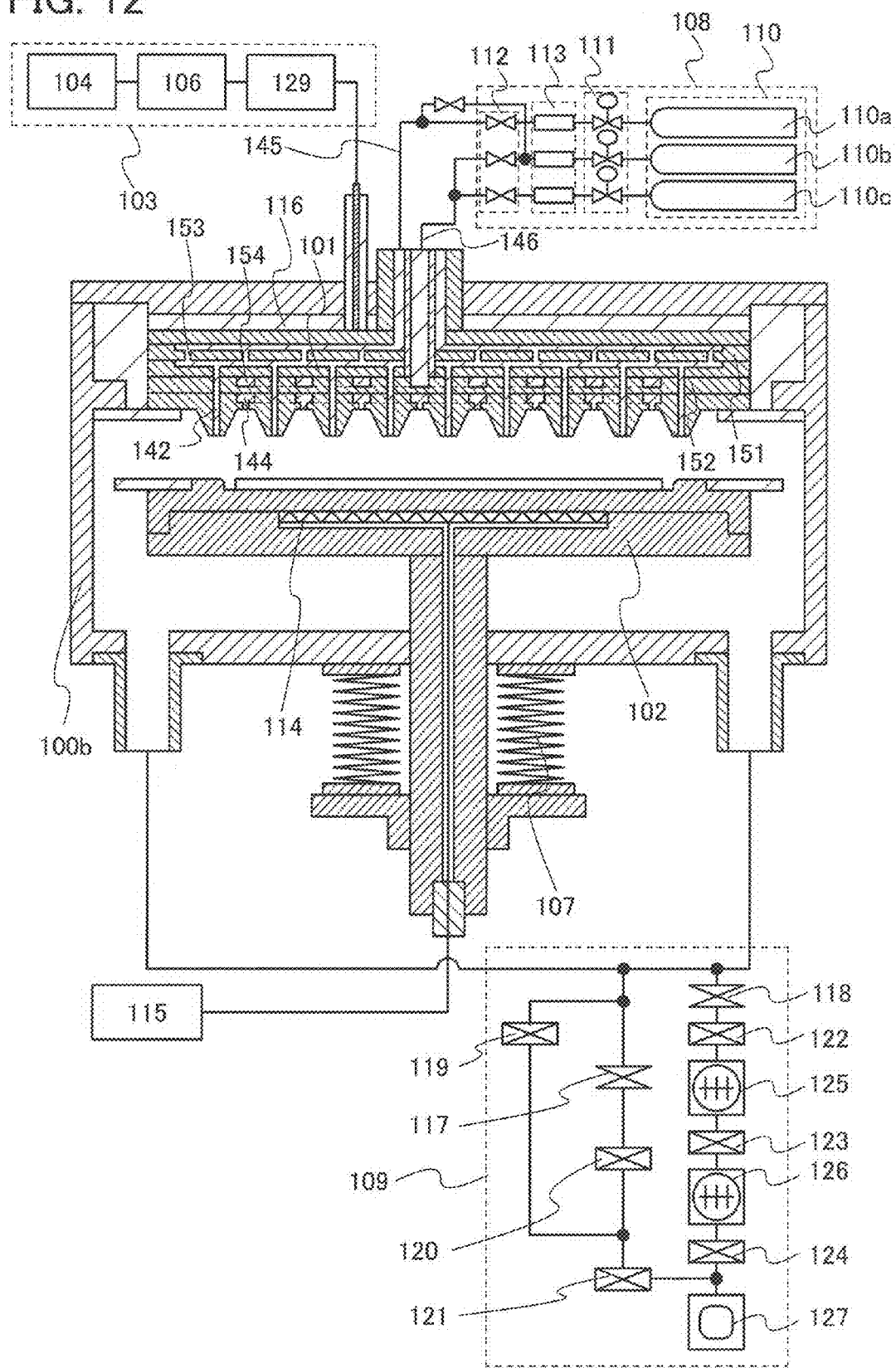
FIG. 12 illustrates an example of a plasma CVD apparatus.

Further, the first electrode 101 may include a plurality of diffusing plates (see FIG. 12). In FIG. 12, a gas supplied through a gas line 145 is diffused by a diffusing plate 151, passes through a through hole 153 of the diffusing plate 151, and then supplied to the reaction chamber 100b through an introduction port of the hollow portion 142 provided in the projected portion 141. Further, a gas supplied through the gas line 146 is diffused by a diffusing plate 152, passes through a through hole 154 of the diffusing plate 152, and then supplied to the reaction chamber 100b through an introduction port of the hollow portion 144 provided on the depressed portion 143. As illustrated in FIG. 12, when the first electrode 101 includes the diffusing plates 151 and 152, the gases introduced through the gas lines 145 and 146 are sufficiently diffused into the first electrode 101 and therefore a homogeneous gas can be supplied to the reaction chamber 100b, whereby a high quality uniform film can be formed over a substrate.

Figure 13A:
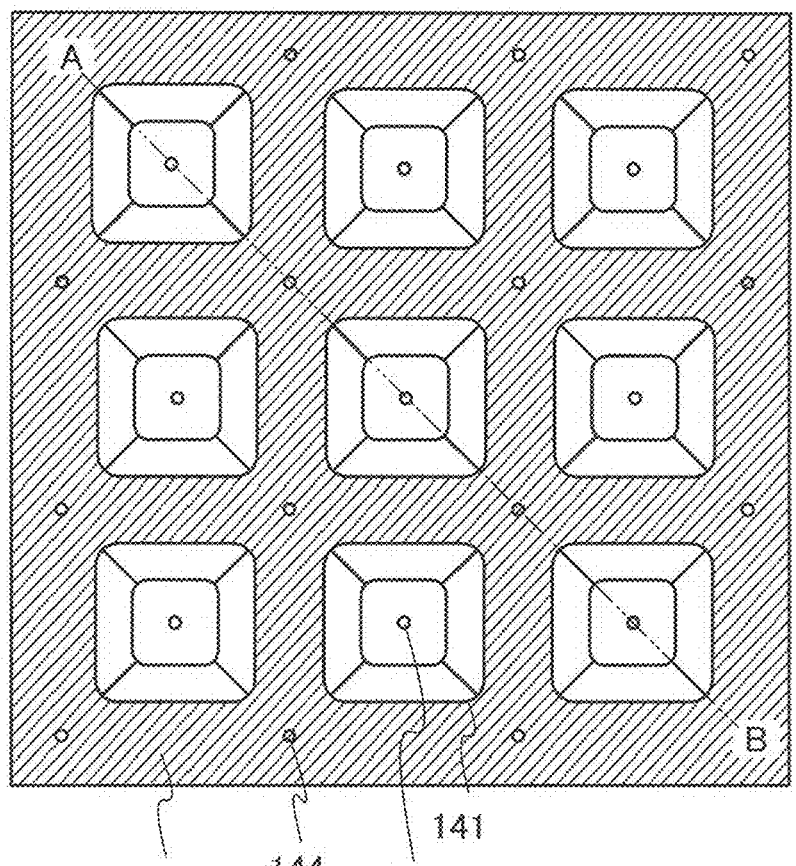
FIGS. 13A and 13B illustrate a shape of an upper electrode of the plasma CVD apparatus.
Figure 13B:
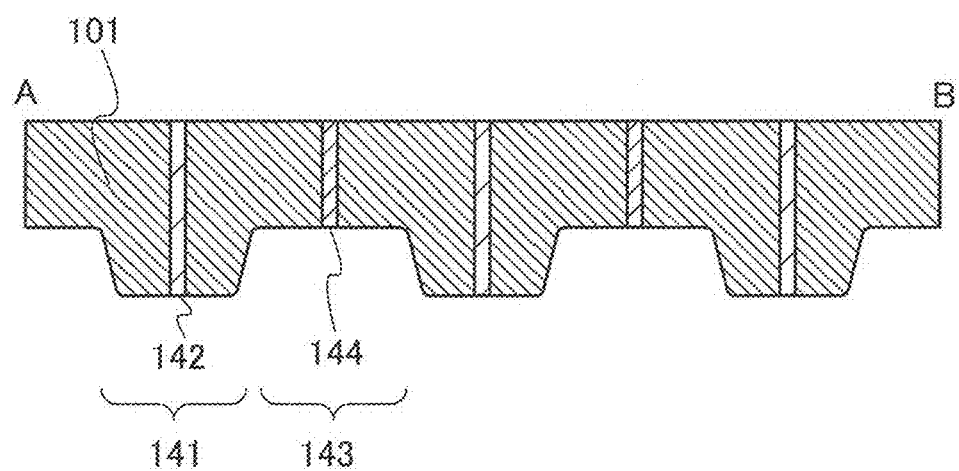
Figure 14A:
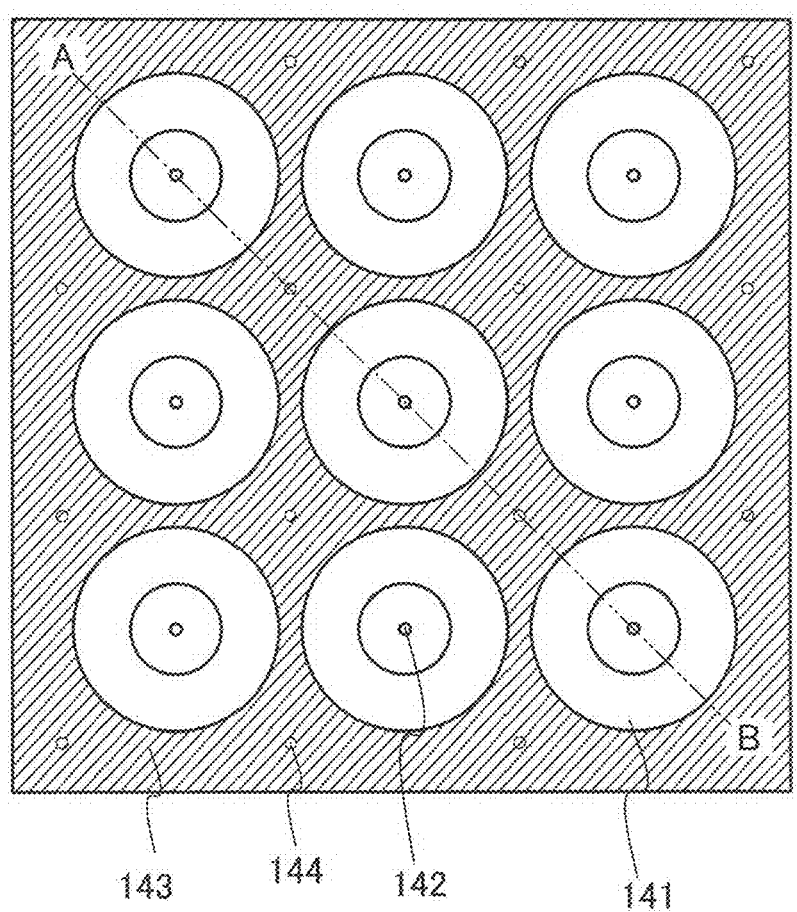
FIGS. 14A and 14B illustrate a shape of an upper electrode of the plasma CVD apparatus.
Figure 14B:
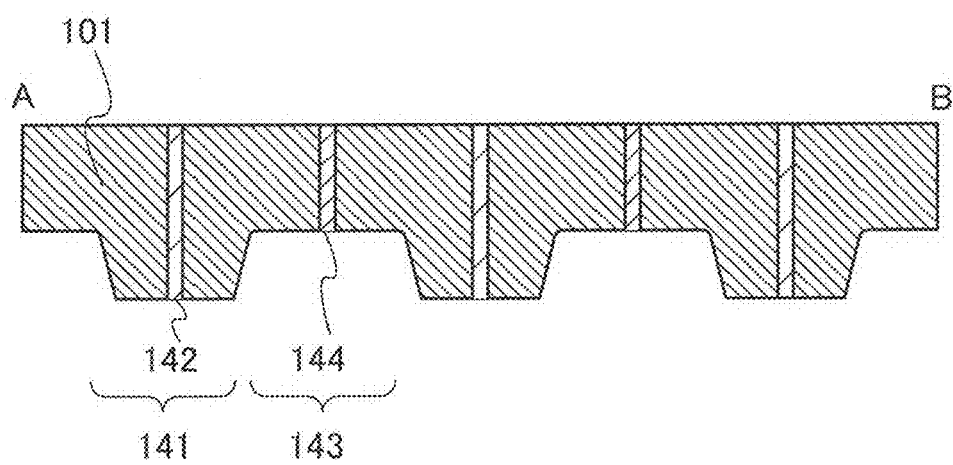

Here, examples of the shape of the first electrode 101 are described with reference to FIGS. 13A and 13B and FIGS. 14A and 14B. FIGS. 13A and 14A are plan views of the first electrode 101 seen from the second electrode 102 side. FIGS. 13B and 14B are cross-sectional views taken along line A-B in FIGS. 13A and 14A. Note that in FIGS. 13A and 14A, regions which are depressed (that is, depressed portions) are shown in fine hatching for clear illustration of the state of unevenness.

As illustrated in FIGS. 13A and 13B, the gas supply ports of the hollow portions 142 formed in the projected portion 141 and the gas supply ports of the hollow portions 144 formed in the depressed portion 143 are provided regularly, preferably at regular intervals. Further, the gas supply ports of the hollow portions 142 are provided in the projected portion 141, and the gas supply ports of the hollow portions 144 are provided in the depressed portions 143. The plurality of projected portions 141 are separated from one another, and the depressed portions 143 form a continuous plane (common plane). In other words, there are projected structure bodies provided so as to project over the common plane where the gas supply ports are provided, and the projected structure bodies are each isolated. Here, the projected portions 141 each have the shape of a truncated quadrangular pyramid. Note that the shape of the projected portions 141 is not limited thereto and may be a truncated triangular pyramid, a truncated pentagonal pyramid, a truncated hexagonal pyramid, or any other truncated polygonal pyramid as appropriate. Preferably, rounded portions of the edge and corner of the projected portion 141 are chamfered to form a truncated polygonal pyramid with the corners rounded. By chamfering the rounded portions of the edges and corners of the projected portions 141 and the depressed portions 143, overconcentration of an electric field can be reduced. Accordingly, local arc discharge can be suppressed, leading to less generation of particles.

Alternatively, as illustrated in FIGS. 14A and 14B, the projected portions 141 may each have the shape of a truncated cone. Further, the gas supply ports of the hollow portions 142 are provided in the projected portions 141, and the gas supply ports of the hollow portions 144 are provided in the depressed portions 143. Note that the rounded portion of the edge of the projected portion 141 is preferably chamfered to form a truncated cone with the corners rounded. Typically, the projected portion 141 can be tapered so that corners 156 and 158 can be chamfered. Further, the projected portion 143 can be tapered. By tapering the projected portion 141 and the depressed portion 143 and chamfering the corners 156 and 158, concentration of an electric field at these portions can be reduced, leading to less generation of particles (see FIG. 15A). When the projected portions 141 each have the shape of a truncated cone and the rounded portions of the edges of the projected portions 141 and the depressed portions 143 are chamfered, overconcentration of an electric field can be reduced. Accordingly, local arc discharge can be suppressed, leading to less generation of particles.

Although the projected portions 141 each have the shape of a truncated polygonal pyramid or a truncated cone with the corners rounded in FIGS. 13A and 13B and FIGS. 14A and 14B, the edge and corner of the truncated polygonal pyramid or truncated cone may be chamfered without being rounded.

Figure 15A:
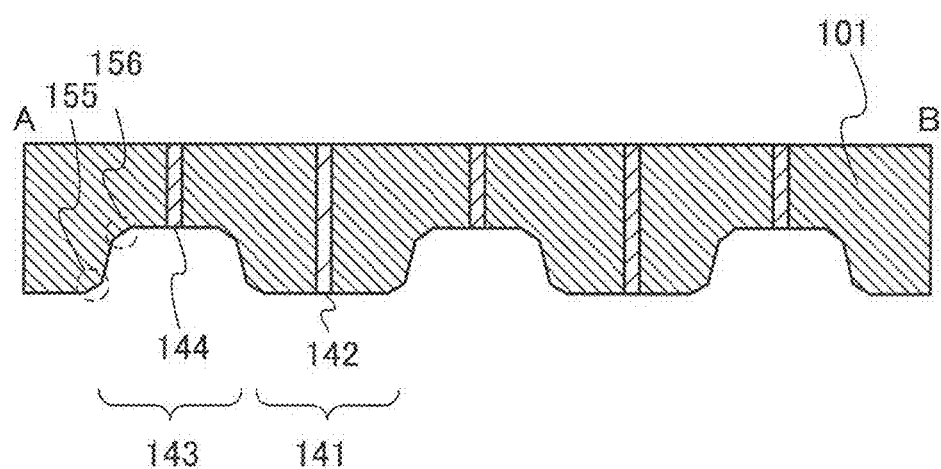
FIGS. 15A and 15B illustrate a shape of an upper electrode of the plasma CVD apparatus.
Figure 15B:
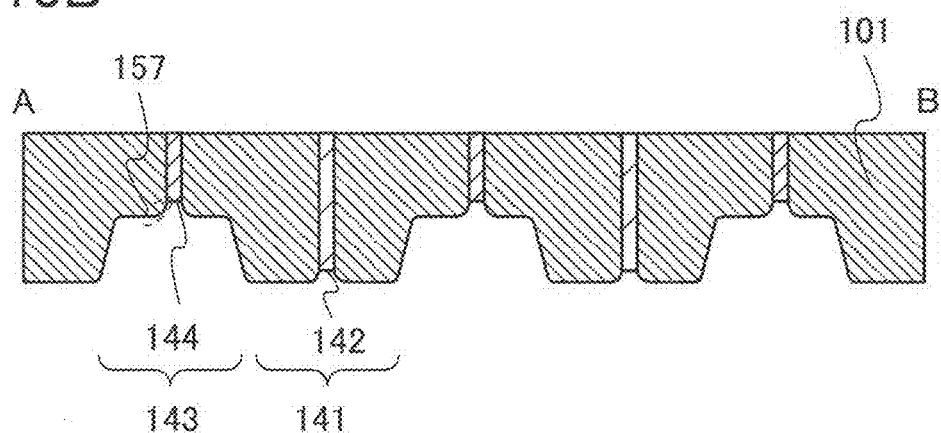

The edge and a corner 157 in the periphery of the gas supply port of the hollow portion 144 may be rounded (see FIG. 15B). The periphery of the gas supply port of the hollow portion 144 may be chamfered without being rounded, although not illustrated. Accordingly, concentration of an electric field in the periphery of the gas supply port can be reduced, leading to less generation of particles.

For example, in the case where the deposition precursor of silicon is generated, a crystalline structure can be obtained by diluting silane ($SiH_4$) with hydrogen. It is considered that this mechanism is similar to that of surface reaction that occurs in deposition of a microcrystalline silicon film, and that reaction between hydrogen and a radical which is generated after dissociation of silane is mainly contributed to generation of the deposition precursor of silicon, which has a crystalline structure.

In this case, for example, when a silane gas or a silane gas diluted with hydrogen is used as the gas supplied through the gas supply port of the hollow portion 144 provided in the depressed portion, growth of the deposition precursor is promoted, whereby the deposition rate of a film deposited over the substrate 40 can be improved. When the gas supplied through the gas supply port of the hollow portion 144 provided in the depressed portion is a rare gas such as xenon, krypton, or argon, decomposition of silane is promoted by excited species of the rare gas, which contributes to generation of higher-order radicals.

Since the first electrode shown in this embodiment has the projected portions 141 and the depressed portions 143, a high-density plasma region can be formed at the apex of the projected portion 141. Thus, in the high-density plasma region, reactivity can be increased to promote generation of the nuclei and the deposition precursors. Accordingly, as in Embodiment 1, well-ordered deposition precursors formed in a gas phase are deposited over a surface of a substrate to be crystal nuclei so that the crystal nuclei can be used as nuclei of crystal growth over the substrate. In addition, a crystalline deposition precursor can be included in a film to be deposited. Further, when a microcrystalline semiconductor film is deposited over crystal nuclei, crystals are grown from an interface between a base film and crystal nuclei using well-ordered crystal nuclei as nuclei. Thus, a microcrystalline semiconductor film having high crystallinity can be formed from the interface between the base film and the crystal nuclei. Furthermore, the generation rate of a deposition precursor is increased in such a manner that a high-density plasma region is formed in the vicinity of the projected portions, and the pressure of the film formation chamber is set to higher than the film formation pressure of the conventional microcrystalline semiconductor film, which is typically greater than or equal to 450 Pa and less than or equal to 13332 Pa, preferably, greater than or equal to 450 Pa and less than or equal to 2000 Pa, more preferably, greater than or equal to 500 Pa and less than or equal to 1500 Pa. Accordingly, the adjacent crystal nuclei 44 which are in close contact can be deposited over the base film 42, and an amorphous semiconductor and a low-concentration region (also referred to as a cavity) between the crystal grains are reduced; therefore, the film formation rate of the microcrystalline semiconductor film having high crystallinity can be improved.

Embodiment 5

In this embodiment, a method for forming a microcrystalline semiconductor film having much higher crystallinity than the microcrystalline semiconductor films in Embodiments 1 to 4 is described.

In this embodiment, as a source gas of the deposition precursor 43 and the microcrystalline semiconductor film 46 in FIGS. 1A and 1B, a rare gas such as argon, xenon, or krypton is used in addition to hydrogen and a deposition gas containing silicon or germanium.

Electron density and the amount of hydrogen radicals in plasma are increased by using a rare gas such as argon, xenon, or krypton, as a source gas, which has low excitation energy and has metastable energy close to dissociation energy of silane and hydrogen. Further, because electron temperature is lowered, potential difference in plasma is reduced and damage to the microcrystalline semiconductor film is reduced, whereby the microcrystalline semiconductor film 46 can be formed. By using a rare gas as the source gas, plasma is stabilized, dissociation of hydrogen and the deposition gas containing silicon or germanium is promoted, and the amount of active radicals is increased. Therefore, reaction between the active radicals is promoted and a generation rate of the deposition precursor 43 and the film-formation rate of the microcrystalline semiconductor film 46 are increased. Further, as the film-formation rate is increased, the deposition time of the microcrystalline semiconductor film 46 is shortened and the amount of impurities taken in a reaction chamber during deposition is reduced. Consequently, the amount of impurities included in the microcrystalline semiconductor film 46 is reduced, whereby the crystallinity of the microcrystalline semiconductor film 46 can be enhanced.

Embodiment 6

In this embodiment, one mode of a photoelectric conversion device is described. In the photoelectric conversion device described in this embodiment, the microcrystalline semiconductor film having high crystallinity as described in Embodiments 1 to 5 is applicable to a semiconductor film effective in photoelectric conversion, a semiconductor film having a conductivity type, or the like, and is preferably applied to a semiconductor film effective in photoelectric conversion in particular. Alternatively, at an interface between the semiconductor film effective in photoelectric conversion or the semiconductor film having a conductivity type and another film, a microcrystalline semiconductor film in which the number and size of gaps between crystal grains are extremely small and the crystallinity is high can be formed.

By employing the structure as described above, resistance (series resistance) caused by the semiconductor film effective in photoelectric conversion or the semiconductor film having a conductivity type can be reduced, resulting in improvement of properties of the photoelectric conversion device. Further, it is possible to suppress optical and electrical loss at the interface between the semiconductor film effective in photoelectric conversion or the semiconductor film having a conductivity type and another film, so that the photoelectric conversion efficiency can be improved. With reference to FIGS. 16A to 16D and FIG. 17, one mode of a method for fabricating a photoelectric conversion device will now be described.

As illustrated in FIG. 16A, a first electrode 202 is formed over a substrate 200.

As the substrate 200, any of a variety of glass substrates used in the electronics industry, such as a substrate of aluminosilicate glass, a barium borosilicate glass, aluminoborosilicate glass, or the like is typically used. Alternatively, a quartz substrate, a sapphire substrate, or the like can be used. Further alternatively, a substrate containing an organic material can be used. As the substrate containing a thermosetting resin such as an organic material, it is preferable to use a substrate containing an epoxy resin, an unsaturated polyester resin, a polyimide resin, a bismaleimide-triazine resin, or a cyanate resin, or a substrate containing a thermosetting resin such as a polyphenylene oxide resin, a polyetherimide resin, or a fluorine resin.

Note that a surface of the substrate 200 may have a texture structure which is capable of improving the photoelectric conversion efficiency.

In this embodiment, since light enters from the back side (the lower part in the drawing) of the substrate 200, a light-transmitting substrate is used. However, the present invention is not limited thereto in the case where light enters from the second electrode side (the upper part in the drawing); in this case, a semiconductor substrate containing a material such as silicon or a conductive substrate containing a metal material or the like may be used.

For the first electrode 202, an electrode using a light-transmitting conductive material is typically used. Examples of light-transmitting conductive materials include oxides (metal oxides) such as In—Sn—Zn—O-based oxide, In—Al—Zn—O-based oxide, Sn—Ga—Zn—O-based oxide, Al—Ga—Zn—O-based oxide, Sn—Al—Zn—O-based oxide, In—Zn—O-based oxide, Sn—Zn—O-based oxide, Al—Zn—O-based oxide, In—O-based oxide, Sn—O-based oxide, and Zn—O-based oxide. In particular, it is preferable to use indium oxide, an indium oxide-tin alloy (ITO), zinc oxide, an indium oxide-zinc oxide alloy, or the like. Alternatively, a Zn—O—Al—N-based material can be used. Further, the light-transmitting conductive material is not limited to an inorganic material, and may be an organic material. As an organic material, it is possible to use a material such as polyaniline, polypyrrole, polythiophene, or a derivative thereof (a conductive high molecular material). The first electrode 202 is formed by a sputtering method, a CVD method, a vacuum evaporation method, a coating method, a printing method, or the like.

The first electrode 202 is formed to a thickness of 10 nm to 500 nm, preferably 50 nm to 100 nm. The sheet resistance of the first electrode 202 is set to about 20 Ω/sq. to 200 Ω/sq.

Note that in this embodiment, since light enters from the back side (the lower part in the drawing) of the substrate 200, the first electrode 202 is formed using a light-transmitting conductive material. However, the present invention is not limited thereto in the case where light enters from the second electrode side (the upper part in the drawing). In such a case, the first electrode 202 can be formed using a conductive material that does not have a light-transmitting property such as aluminum, platinum, gold, silver, copper, titanium, tantalum, or tungsten. In particular, when a material that easily reflects light, such as aluminum, silver, titanium, or tantalum, is used, photoelectric conversion efficiency can be sufficiently improved.

Like the surface of the substrate 200, a surface of the first electrode 202 may have a texture structure. Further, an auxiliary electrode formed using a low-resistant conductive material may be separately formed so as to be in contact with the first electrode 202.

Next, as illustrated in FIG. 16B, a semiconductor film 204 having a first conductivity type is formed over the first electrode 202, a semiconductor film 206 effective in photoelectric conversion is formed over the semiconductor film 204 having the first conductivity type, and a semiconductor film 208 having a second conductivity type is formed over the semiconductor film 206 effective in photoelectric conversion.

The semiconductor film 204 having the first conductivity type is typically formed using a semiconductor film containing a semiconductor material to which an impurity element imparting a conductivity type is added. Silicon is suitable for the semiconductor material, considering productivity, a price, or the like. When silicon is used as the semiconductor material, phosphorus or arsenic, which imparts n-type conductivity, aluminum or boron, which imparts p-type conductivity, or the like is used as the impurity element imparting a conductivity type.

In this embodiment, since light enters from the back side (the lower part in the drawing) of the substrate 200, the conductivity type (first conductivity type) of the semiconductor film 204 having the first conductivity type is preferably a p-type. This is because, for instance, the diffusion length of holes is short as a result of the lifetime of a hole which is as short as half that of an electron, and because more electrons and holes are formed on the side where light enters incident in the semiconductor film effective in photoelectric conversion. By applying a p-type to the first conductivity type, a current can be extracted before holes are annihilated, whereby a decrease of photoelectric conversion efficiency can be suppressed. Note that when there is no possibility of the above problems, for example, when the semiconductor film effective in photoelectric conversion is sufficiently thin, the first conductivity type may be an n-type.

Although there is no limitation on the crystallinity of the semiconductor film 204 having the first conductivity type, the microcrystalline semiconductor film having high crystallinity which is described in Embodiments 1 to 5 is preferably used as the semiconductor film 204. This is because in this case, as compared with use of a conventional microcrystalline semiconductor film, it is possible to reduce series resistance and to suppress optical and electrical loss at the interface between the semiconductor film 204 having the first conductivity type and another film. It is needless to say that other semiconductors such as an amorphous semiconductor, a polycrystalline semiconductor, and a single crystal semiconductor can also be used.

Like the surface of the substrate 200, a surface of the semiconductor film 204 having the first conductivity type may have a texture structure.

The semiconductor film 204 having the first conductivity type can be formed using a deposition gas containing silicon and diborane by a plasma CVD method. Further, the semiconductor film 204 having the first conductivity type is formed to a thickness of 1 nm to 100 nm, preferably 5 nm to 50 nm.

Alternatively, the semiconductor film 204 having the first conductivity type may be formed in a manner such that a silicon film to which an impurity element imparting a conductivity type is not added is formed by a plasma CVD method or the like which followed by addition of boron by an ion implantation method or the like.

The semiconductor film 206 effective in photoelectric conversion is formed. As the semiconductor film effective in photoelectric conversion, silicon, silicon germanium, or the like is used as a semiconductor material.

Here, as a method of manufacturing the semiconductor film 206 effective in photoelectric conversion, the process for manufacturing the microcrystalline semiconductor film described in Embodiments 1 to 5 is used. By applying the microcrystalline semiconductor film described in Embodiments 1 to 5 to the semiconductor film 206 effective in photoelectric conversion, optical and electrical loss at the interface between the semiconductor film 204 and another film can be suppressed as compared with the use of the conventional microcrystalline semiconductor film.

Because the semiconductor film 206 effective in photoelectric conversion needs to realize sufficient light absorption, it preferably has a thickness of about 100 nm to 10 μm.

In this embodiment, the second conductivity type is an n-type. The semiconductor film 208 having the second conductivity type can be formed using a material such as silicon to which phosphorus is added as an impurity element imparting a conductivity type. Semiconductor materials that can be used for the semiconductor film 208 having the second conductivity type are the same as those for the semiconductor film 204 having the first conductivity type.

The semiconductor film 208 having the second conductivity type can be formed like the semiconductor film 204 having the first conductivity type. For instance, the semiconductor film 208 can be formed using a deposition gas containing silicon and phosphine by a plasma CVD method. Also as the semiconductor film 208 having the second conductivity type, it is preferable to use the microcrystalline semiconductor film having high crystallinity which is described in Embodiments 1 to 5.

In this embodiment, since light enters from the back side (the lower part in the drawing) of the substrate 200, the conductivity type (second conductivity type) of the semiconductor film 208 having the second conductivity type is preferably an n-type, but an embodiment of the present invention is not limited thereto. When the first conductivity type is an n-type, the second conductivity type is a p-type.

Through the above process, a unit cell 210 which has the semiconductor film 204 having the first conductivity type, the semiconductor film 206 effective in photoelectric conversion, and the semiconductor film 208 having the second conductivity type is completed.

In order to form a plurality of unit cells over one substrate, openings $C_0$ to $C_n$ penetrating through the unit cell 210 and the first electrode 202 are formed by a laser processing method. By this step, the first electrode 202 is divided into first electrodes $T_1$ to $T_n$. Further, the unit cell 210 is divided into unit cells $K_1$ to $K_n$ (see FIG. 16C).

The openings $C_0, C_2, C_4, \ldots C_{n-2}$, to $C_n$ are openings for insulation. The openings $C_1, C_3, C_5, \ldots C_{n-1}$ are openings for forming connection between the first electrode 202 and a second electrode formed later. By performing laser processing with the first electrode 202 and the unit cell 210 stacked, separation of the first electrode 202 from the substrate 200 can be prevented in the processing.

Next, insulating resin layers $Z_0$ to $Z_n$ for filling the openings $C_0, C_2, C_4, \ldots C_{n-2}$, to $C_n$ and covering upper end portions of these openings are formed (see FIG. 16D). The insulating resin layers $Z_0$ to $Z_n$ may be formed using a resin material having an insulating property such as an acrylic-based resin, a phenol-based resin, an epoxy-based resin, or a polyimide-based resin by a screen printing method. For example, an insulating resin pattern is formed by a screen printing method so that the openings $C_0, C_2, C_4, \ldots, C_{n-2}$, and $C_n$ are filled with a resin composition in which cyclohexane, isophorone, high resistance carbon black, aerosil, a dispersing agent, a defoaming agent, and a leveling agent are mixed with a phenoxy resin. After the insulating resin pattern is formed, thermal hardening is performed in an oven at 160° C. for 20 minutes. Thus, the insulating resin layers $Z_0$ to $Z_n$ are obtained.

Figure 17:
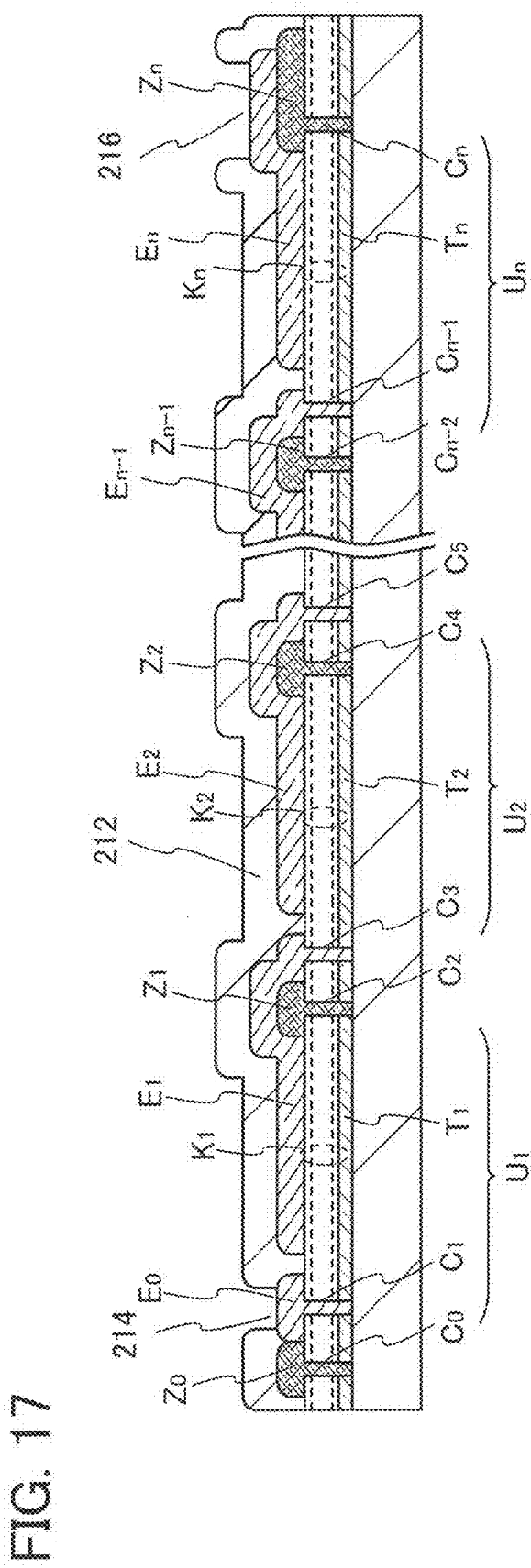
FIG. 17 illustrates the method of manufacturing a photoelectric conversion device.

Next, the second electrodes $E_0$ to $E_n$ are formed (see FIG. 17). The second electrodes $E_0$ to $E_n$ are formed using a conductive material such as metal. They can be formed using a material that easily reflects light, such as aluminum, silver, titanium, or tantalum, for instance. It is preferable to use a material that easily reflects light to form the second electrodes $E_0$ to $E_n$, because in this case light that has not been absorbed by the semiconductor film effective in photoelectric conversion can again enter the semiconductor film effective in photoelectric conversion, resulting in improvement of photoelectric conversion efficiency.

As a method of forming the second electrodes $E_0$ to $E_n$, there are a sputtering method, a vacuum evaporation method, a CVD method, a coating method, a printing method, and the like. The second electrodes $E_0$ to $E_n$ are formed to a thickness of 10 nm to 500 nm, preferably 50 nm to 100 nm.

In this embodiment, since light enters from the back side (the lower part in the drawing) of the substrate 200, the second electrodes $E_0$ to $E_n$ are formed using a material that has no light-transmitting property, but the structure of the second electrodes $E_0$ to $E_n$ is not limited thereto. For example, when light enters from the second electrodes $E_0$ to $E_n$ side (the upper part in the drawing), the second electrodes $E_0$ to $E_n$ can be formed using any of the light-transmitting conductive materials for the first electrode 202.

The second electrodes $E_0$ to $E_n$ are formed so as to be connected to the first electrodes $T_1$ to $T_n$ in the openings $C_1$, $C_3$, $C_5$, ..., $C_{n-1}$. In other words, the openings $C_1$, $C_3$, $C_5$, ..., $C_{n-1}$ are filled with the second electrodes $E_0$ to $E_n$. In this way, for example, the second electrode $E_1$ is electrically connected to the first electrode $T_2$, and the second electrode $E_{n-1}$ is electrically connected to first electrode $T_n$. Thus, each of the second electrodes can be electrically connected to the first electrode adjacent to the corresponding second electrode, and the unit cells $K_1$ to $K_n$ are electrically connected in series.

Further, an auxiliary electrode formed using a low-resistant conductive material may be formed so as to be in contact with the second electrodes $E_0$ to $E_n$.

A sealing resin layer 212 is formed using an epoxy resin, an acrylic resin, or a silicone resin. In the sealing resin layer 212, an opening portion 214 and an opening portion 216 are respectively formed over the second electrode $E_0$ and the second electrode $E_n$. The second electrodes $E_0$ and $E_n$ are connected respectively through the opening portions 214 and 216 to external wirings.

Thus, a unit cell $U_n$ including the first electrode $T_n$, the unit cell $K_n$ and the second electrode $E_n$ is formed over the substrate 200. Further, the first electrode $T_n$, is connected to the adjacent second electrode $E_{n-1}$ adjacent to the corresponding second electrode in the opening $C_{n-1}$. Accordingly, the photoelectric conversion device in which n unit cells are connected in series can be fabricated. The second electrode $E_0$ serves as an output electrode for the first electrode $T_1$ in the unit cell $U_1$.

By the above method, it is possible to fabricate a photoelectric conversion device in which a microcrystalline semiconductor film having high crystallinity is used as any of a semiconductor film effective in photoelectric conversion, a semiconductor film having a first conductivity type, or a semiconductor film having a second conductivity type. This can enhance the photoelectric conversion efficiency of a photoelectric conversion device. Note that, as long as the microcrystalline semiconductor film having high crystallinity may be used as any of the semiconductor film effective in photoelectric conversion, the semiconductor film having the first conductivity type, or the semiconductor film having the second conductivity type, the film to which the microcrystalline semiconductor film is applied can be changed as appropriate. Further, when a microcrystalline semiconductor film in which the number and size of gaps between crystal grains are extremely small and the crystallinity is high is used as more than one of the above semiconductor films, a greater effect can be achieved.

Note that although a photoelectric conversion device having one unit cell is described in this embodiment, a photoelectric conversion device in which two or more unit cells are stacked as appropriate can be provided.

This embodiment can be implemented in appropriate combination with the other embodiments.

Embodiment 7

Figure 18:
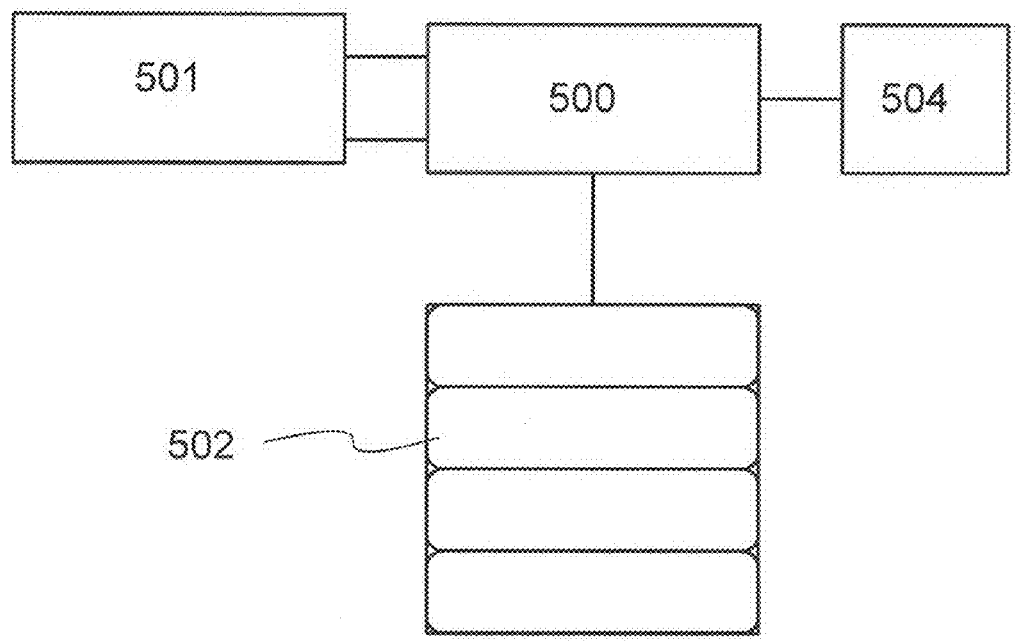
FIG. 18 illustrates a structure of a solar photovoltaic system.

FIG. 18 illustrates an example of a solar photovoltaic system in which a photoelectric conversion device 501 described in the above embodiment is used. In a charge control circuit 500, a storage battery 502 is charged using electric power supplied from one or a plurality of photoelectric conversion devices 501. Further, in the case where the storage battery 502 is sufficiently charged, electric power supplied from the photoelectric conversion device 501 is directly output to a load 504.

When an electric double layer capacitor is used as the storage battery 502, chemical reaction is not necessary for charging; thus, the storage battery 502 can be charged rapidly. Further, lifetime can be increased about 8-fold and charging and discharging efficiency can be increased about 1.5-fold, compared with those of a lead storage battery or the like which uses chemical reaction. The solar photovoltaic system described in this embodiment can be used in a variety of loads 504 which use electric power, such as lighting or an electronic device.

This embodiment can be implemented in combination with any of the other embodiments, as appropriate.

Example 1

In this example will be described results obtained using computer simulation to examine a state where crystallinity of a microcrystalline semiconductor film is improved due to a high-pressure condition or an argon doping condition. Specifically, comparison results of the densities calculated in hydrogen radical densities in different pressures and using different gas species are shown. Note that multi-physics analysis software CFD-ACE+ manufactured by CFD Research Corporation was used for the calculation.

Figure 19:
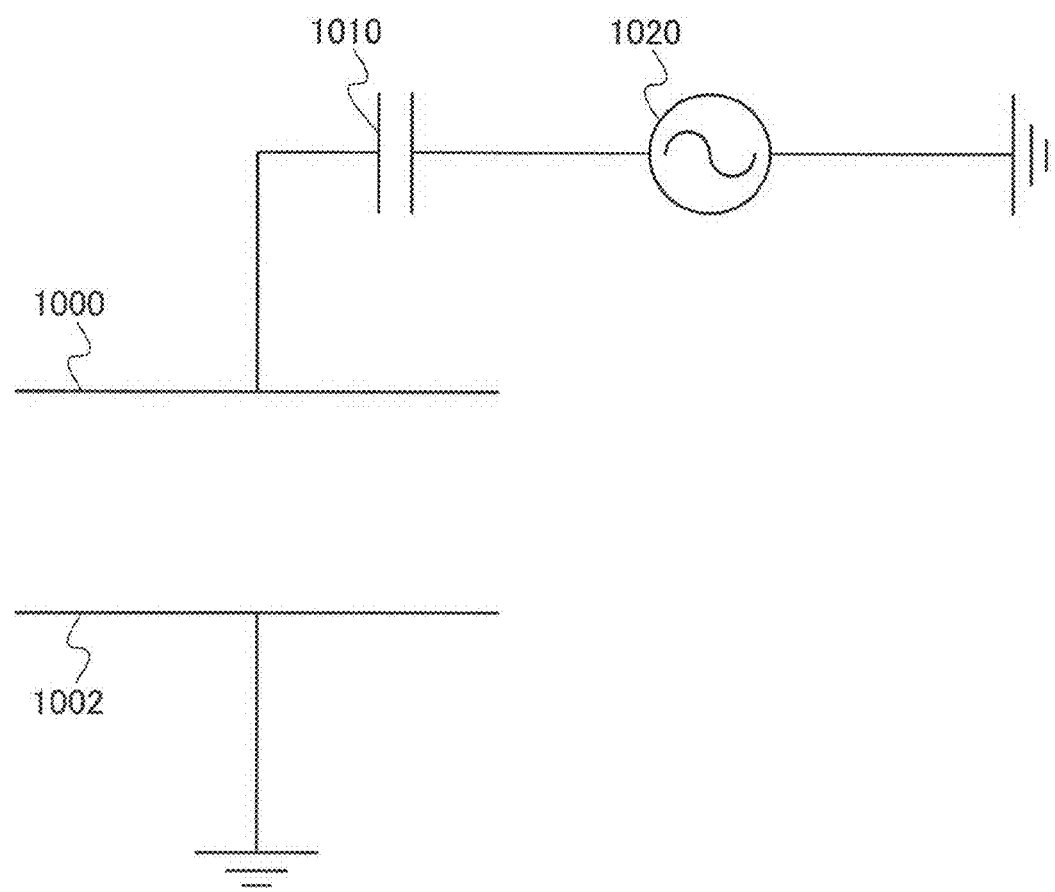
FIG. 19 illustrates a schematic structure of a film formation apparatus.

As a model of a film formation apparatus for the calculation, a parallel plate capacitive coupling CVD apparatus was assumed. A schematic structure of the film formation apparatus is illustrated in FIG. 19. An upper electrode 1000 (may also be referred to as an RF electrode) is connected to a high-frequency power source 1020 via a capacitor 1010. A lower electrode 1002 which functions as a substrate stage is grounded.

Figure 20:
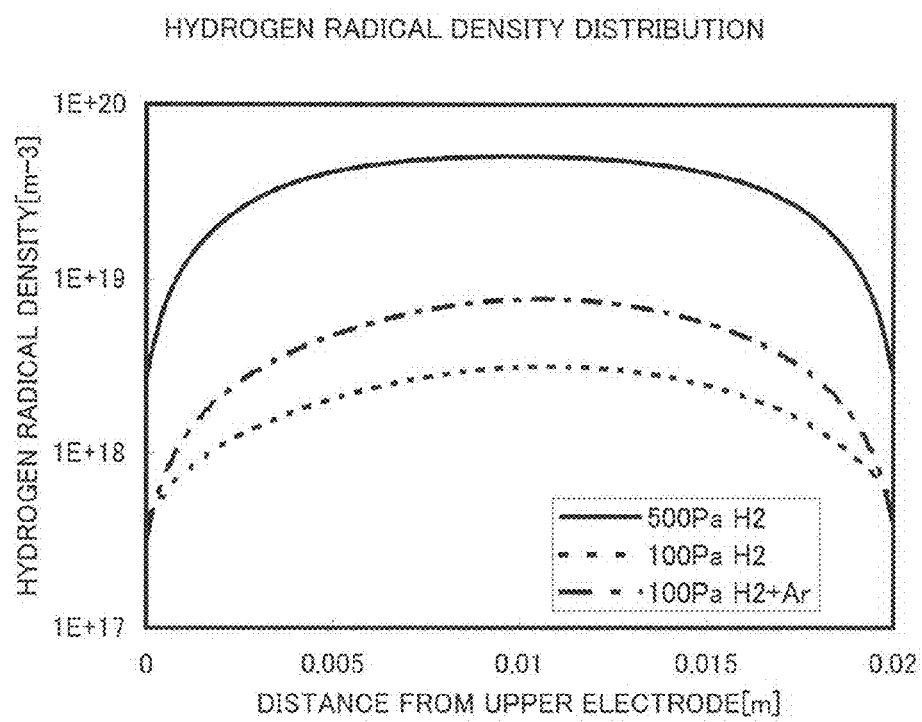
FIG. 20 shows the density of hydrogen radicals.

The hydrogen radical densities obtained by the calculation are shown in FIG. 20. In FIG. 20, the horizontal axis represents a distance (m) from the upper electrode, and the vertical axis represents hydrogen radical density ($m^{-3}$). From FIG. 20, it is apparent that the hydrogen radical density is higher in the case where a high-pressure condition (500 Pa, $H_2$) is used than in the case where a low-pressure condition (100 Pa, $H_2$)

is used. This is due to the collision dissociation rate of hydrogen which is higher in the case where the higher-pressure condition is used than in the case where the low-pressure condition is used.

In addition, it is apparent that the hydrogen radical density of a mixed gas to which argon is added (100 Pa, $H_2$+Ar) is higher than that of hydrogen alone (100 Pa, $H_2$). Since the density of hydrogen molecules is reduced by addition of argon, the collision dissociation rate of hydrogen is reduced; however, it is considered that decomposition of hydrogen is promoted by reactions below in a gas phase and thus the hydrogen radical density is increased.

$$Ar^+ + H_2 \rightarrow H^+ + H + Ar \tag{1}$$

$$ArH^+ + H_2 \rightarrow H_3^+ + Ar \tag{2}$$

$$H^- + ArH^+ \rightarrow Ar + 2H \tag{3}$$

$$e + ArH^- \rightarrow Ar + H \tag{4}$$

$$H^- + Ar^+ \rightarrow Ar + H \tag{5}$$

$$Ar(4s) + H_2 \rightarrow 2H + Ar \tag{6}$$

$$Ar(4p) + H_2 \rightarrow 2H + Ar \tag{7}$$

Reaction between hydrogen radicals is promoted by the increase in the hydrogen radical density. Then, excess energy is released by the reaction and thus a heating effect is generated on a reaction surface. For example, in the case where the reaction is generated on a surface of a higher-order radical $(SiH_n)_x$ (n=1, 2, 3), the crystallinity of the higher-order radical is improved by the excess energy.

As described above, the hydrogen density largely affects generation of a crystal nucleus that has favorable crystallinity. It is found that the results of the above calculation reveal that crystallinity of a microcrystalline semiconductor film is improved by increasing hydrogen radical density.

This application is based on Japanese Patent Applications serial no. 2009-194806, 2009-194855, and 2009-194846 filed with the Japan Patent Office on Aug. 25, 2009, the entire contents of which are hereby incorporated by reference.

What is claimed is:

1. A method of manufacturing a photoelectric conversion device comprising a first electrode, a unit cell, and a second electrode over a substrate, comprising the steps of:
    forming a plasma region between an upper electrode and a lower electrode by supplying high-frequency power of 60 MHz or less to the upper electrode under a condition where a pressure of a reactive gas in a reaction chamber of a plasma CVD apparatus is set to greater than or equal to 450 Pa and less than or equal to 13332 Pa and a distance between the upper electrode and the lower electrode of the plasma CVD apparatus is set to greater than or equal to 1 mm and less than or equal to 20 mm;
    forming crystalline deposition precursors in a gas phase including the plasma region;
    forming a crystal nucleus of greater than or equal to 5 nm and less than or equal to 15 nm by depositing the crystalline deposition precursors over the substrate; and
    forming at least one of a first semiconductor film, a second semiconductor film and a third semiconductor film in the unit cell, by growing a crystal from the crystal nucleus,
    wherein a first conductive type of the first semiconductor film and a second conductive type of the third semiconductor film are different from each other.

2. The method of manufacturing the photoelectric conversion device, according to claim 1, wherein a rare gas is introduced to the reaction chamber with the reactive gas.

3. A method of manufacturing a photoelectric conversion device comprising a first electrode, a plurality of unit cells, and a second electrode over a substrate, comprising the steps of:
    forming a plasma region between an upper electrode and a lower electrode by supplying high-frequency power of 60 MHz or less to the upper electrode under a condition where a pressure of a reactive gas in a reaction chamber of a plasma CVD apparatus is set to greater than or equal to 450 Pa and less than or equal to 13332 Pa and a distance between the upper electrode and the lower electrode of the plasma CVD apparatus is set to greater than or equal to 1 mm and less than or equal to 20 mm;
    forming crystalline deposition precursors in a gas phase including the plasma region;
    forming a crystal nucleus of greater than or equal to 5 nm and less than or equal to 15 nm by depositing the crystalline deposition precursors over the substrate; and
    forming at least one of a first semiconductor film, a second semiconductor film and a third semiconductor film in the plurality of unit cells, by growing a crystal from the crystal nucleus,
    wherein a first conductive type of the first semiconductor film and a second conductive type of the third semiconductor film are different from each other.

4. The method of manufacturing the photoelectric conversion device, according to claim 3, wherein a rare gas is introduced to the reaction chamber with the reactive gas.

5. A method of manufacturing a photoelectric conversion device comprising a first electrode, a unit cell, and a second electrode over a substrate, comprising the steps of:
    introducing a reactive gas into a reaction chamber of a plasma CVD apparatus through a gas supply port of an upper electrode with a plurality of projected portions, being opposite to a lower electrode;
    setting a pressure of the reaction chamber to greater than or equal to 450 Pa and less than or equal to 13332 Pa;
    setting a distance between the upper electrode and the lower electrode to greater than or equal to 1 mm and less than or equal to 20 mm;
    forming a plasma region between the upper electrode and the lower electrode by supplying high-frequency power of 60 MHz or less to the upper electrode;
    forming crystalline deposition precursors including a semiconductor in a gas phase including the plasma region;
    forming a crystal nucleus of greater than or equal to 5 nm and less than or equal to 15 nm by depositing the crystalline deposition precursors over the substrate; and
    forming at least one of a first semiconductor film, a second semiconductor film and a third semiconductor film in the unit cell, by growing a crystal from the crystal nucleus,
    wherein a first conductive type of the first semiconductor film and a second conductive type of the third semiconductor film are different from each other.

6. The method of manufacturing the photoelectric conversion device, according to claim 5, wherein a rare gas is introduced to the reaction chamber with the reactive gas.

7. The method of manufacturing the photoelectric conversion device, according to claim 5, wherein the gas supply port is provided between each two of the plurality of projected portions.

8. The method of manufacturing the photoelectric conversion device, according to claim 5, wherein the gas supply port is provided on each of apexes of the plurality of projected portions.

9. A method of manufacturing a photoelectric conversion device comprising a first electrode, a plurality of unit cells, and a second electrode over a substrate, comprising the steps of:
introducing a reactive gas into a reaction chamber of a plasma CVD apparatus through a gas supply port of an upper electrode with a plurality of projected portions, being opposite to a lower electrode;
setting a pressure of the reaction chamber to greater than or equal to 450 Pa and less than or equal to 13332 Pa;
setting a distance between the upper electrode and the lower electrode to greater than or equal to 1 mm and less than or equal to 20 mm;
forming a plasma region between the upper electrode and the lower electrode by supplying high-frequency power of 60 MHz or less to the upper electrode;
forming crystalline deposition precursors including a semiconductor in a gas phase including the plasma region;
forming a crystal nucleus of greater than or equal to 5 nm and less than or equal to 15 nm by depositing the crystalline deposition precursors over the substrate; and
forming at least one of a first semiconductor film, a second semiconductor film and a third semiconductor film in the plurality of unit cells, by growing a crystal from the crystal nucleus,
wherein a first conductive type of the first semiconductor film and a second conductive type of the third semiconductor film are different from each other.

10. The method of manufacturing the photoelectric conversion device, according to claim 9, wherein a rare gas is introduced to the reaction chamber with the reactive gas.

11. The method of manufacturing the photoelectric conversion device, according to claim 9, wherein the gas supply port is provided between each two of the plurality of projected portions.

12. The method of manufacturing the photoelectric conversion device, according to claim 9, wherein the gas supply port is provided on each of apexes of the plurality of projected portions.

13. A method of manufacturing a photoelectric conversion device comprising a first electrode, a unit cell, and a second electrode over a substrate, the method using a plasma CVD apparatus provided with an upper electrode and a lower electrode in a reaction chamber and comprising the steps of:
introducing a reactive gas into the reaction chamber;
setting a pressure of the reaction chamber to greater than or equal to 450 Pa and less than or equal to 13332 Pa;
forming a plasma region between the upper electrode and the lower electrode by supplying high-frequency power of 60 MHz or less to the upper electrode;
forming crystalline deposition precursors in a gas phase including the plasma region;
forming a crystal nucleus of greater than or equal to 5 nm and less than or equal to 15 nm by depositing the crystalline deposition precursors; and
forming at least one of a first semiconductor film, a second semiconductor film and a third semiconductor film in the unit cell, by growing a crystal from the crystal nucleus,
wherein a first conductive type of the first semiconductor film and a second conductive type of the third semiconductor film are different from each other,
wherein the upper electrode comprises:
a plurality of projected portions for forming the plasma in the reaction chamber by supplying the high-frequency power;
a first gas supply port provided on each of apexes of the plurality of projected portions; and
a second gas supply port provided between each two of the plurality of projected portions,
the plurality of projected portions each having a tapered shape and being chamfered, and
wherein a distance between the upper electrode and the lower electrode is greater than or equal to 1 mm and less than or equal to 20 mm.

14. The method of manufacturing the photoelectric conversion device, according to claim 13, wherein a rare gas is introduced to the reaction chamber with the reactive gas.

15. A method of manufacturing a photoelectric conversion device comprising a first electrode, a plurality of unit cells, and a second electrode over a substrate, the method using a plasma CVD apparatus provided with an upper electrode and a lower electrode in a reaction chamber and comprising the steps of:
introducing a reactive gas into the reaction chamber;
setting a pressure of the reaction chamber to greater than or equal to 450 Pa and less than or equal to 13332 Pa;
forming a plasma region between the upper electrode and the lower electrode by supplying high-frequency power of 60 MHz or less to the upper electrode;
forming crystalline deposition precursors in a gas phase including the plasma region;
forming a crystal nucleus of greater than or equal to 5 nm and less than or equal to 15 nm by depositing the crystalline deposition precursors; and
forming at least one of a first semiconductor film, a second semiconductor film and a third semiconductor film in the plurality of unit cells, by growing a crystal from the crystal nucleus,
wherein a first conductive type of the first semiconductor film and a second conductive type of the third semiconductor film are different from each other,
wherein the upper electrode comprises:
a plurality of projected portions for forming the plasma in the reaction chamber by supplying the high-frequency power;
a first gas supply port provided on each of apexes of the plurality of projected portions; and
a second gas supply port provided between each two of the plurality of projected portions,
the plurality of projected portions each having a tapered shape and being chamfered, and
wherein a distance between the upper electrode and the lower electrode is greater than or equal to 1 mm and less than or equal to 20 mm.

16. The method of manufacturing the photoelectric conversion device, according to claim 15, wherein a rare gas is introduced to the reaction chamber with the reactive gas.

* * * * *

UNITED STATES PATENT AND TRADEMARK OFFICE
CERTIFICATE OF CORRECTION

PATENT NO. : 8,207,011 B2  
APPLICATION NO. : 12/860283  
DATED : June 26, 2012  
INVENTOR(S) : Yoshikazu Hiura et al.

Page 1 of 1

It is certified that error appears in the above-identified patent and that said Letters Patent is hereby corrected as shown below:

Col. 16, line 3, "local are discharge can be" should read "local arc discharge can be"

Signed and Sealed this
Fourth Day of September, 2012

David J. Kappos
*Director of the United States Patent and Trademark Office*